United States Patent
Song et al.

(10) Patent No.: US 8,426,956 B2
(45) Date of Patent: Apr. 23, 2013

(54) SEMICONDUCTOR PACKAGE STRUCTURE HAVING PLURAL PACKAGES IN A STACKED ARRANGEMENT

(75) Inventors: In-Sang Song, Seoul (KR); Hye-Jin Kim, Suwon-si (KR); Kyung-Man Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 334 days.

(21) Appl. No.: 12/855,322

(22) Filed: Aug. 12, 2010

(65) Prior Publication Data
US 2011/0095424 A1   Apr. 28, 2011

(30) Foreign Application Priority Data
Oct. 22, 2009   (KR) .................. 10-2009-0100892

(51) Int. Cl.
*H01L 23/488* (2006.01)
(52) U.S. Cl.
USPC ..... 257/686; 257/723; 257/780; 257/E23.172
(58) Field of Classification Search ............ 257/E23.172
See application file for complete search history.

(56) References Cited

U.S. PATENT DOCUMENTS

| 7,185,426 B1 | 3/2007 | Hiner et al. |
| 7,364,946 B2 * | 4/2008 | Karnezos ............. 438/109 |
| 2007/0290376 A1 | 12/2007 | Zhao et al. |
| 2008/0105984 A1 | 5/2008 | Lee |
| 2008/0150158 A1 | 6/2008 | Chin |

FOREIGN PATENT DOCUMENTS

| JP | 2008166527 A | 7/2008 |
| KR | 10-2004-0045696 A | 6/2004 |
| KR | 100770934 B1 | 10/2007 |
| KR | 100842915 B1 | 7/2008 |

* cited by examiner

*Primary Examiner* — Stephen W Smoot
(74) *Attorney, Agent, or Firm* — Harness, Dickey & Pierce, P.L.C.

(57) ABSTRACT

The semiconductor package structure includes first and second packages. The first package has at least one first semiconductor chip disposed on a first printed circuit board, and at least one first pad disposed on the at least one first semiconductor chip. The second package has at least one second pad disposed on the first package, and at least one second semiconductor chip disposed on the at least one second pad. The at least one first semiconductor chip is electrically connected to the first printed circuit board. The at least one second pad is electrically connected to the at least one second semiconductor chip. The at least one second pad faces the at least one first pad.

20 Claims, 13 Drawing Sheets

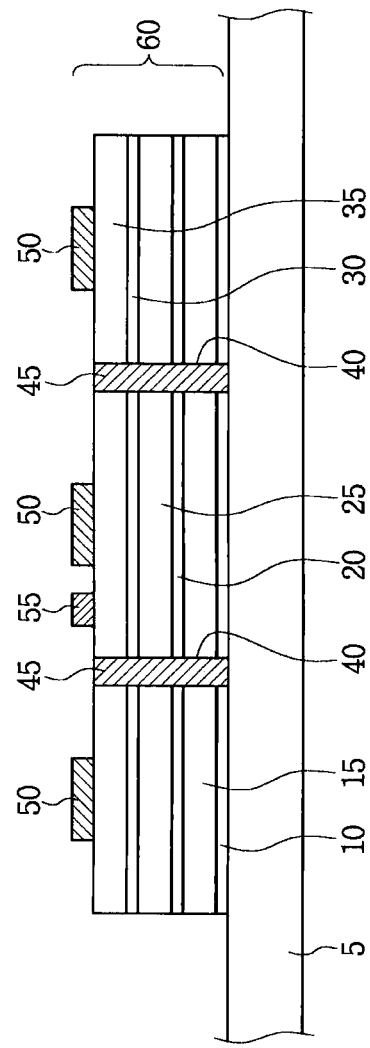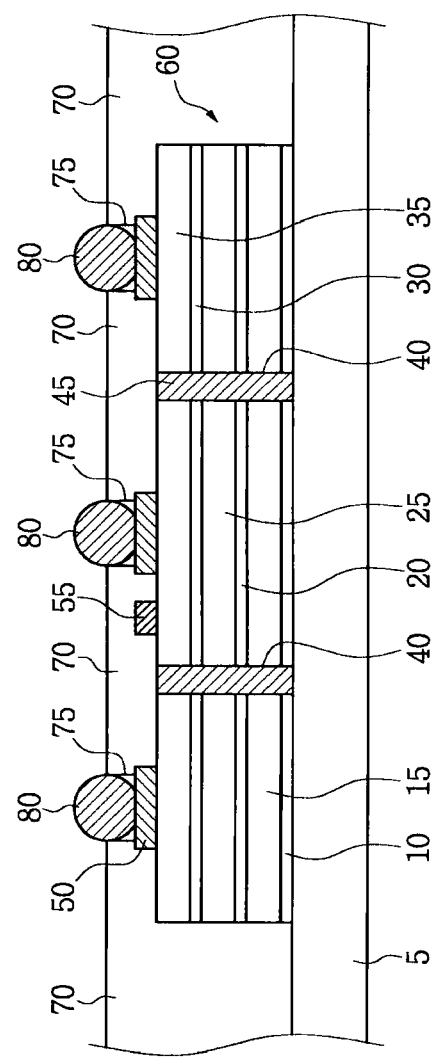

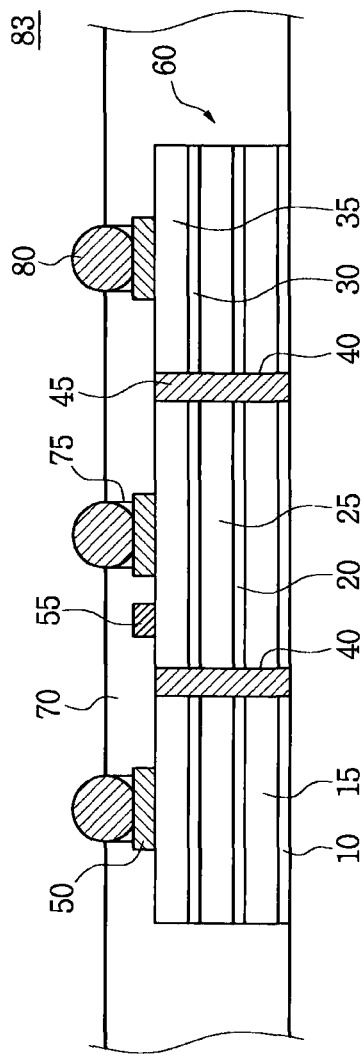
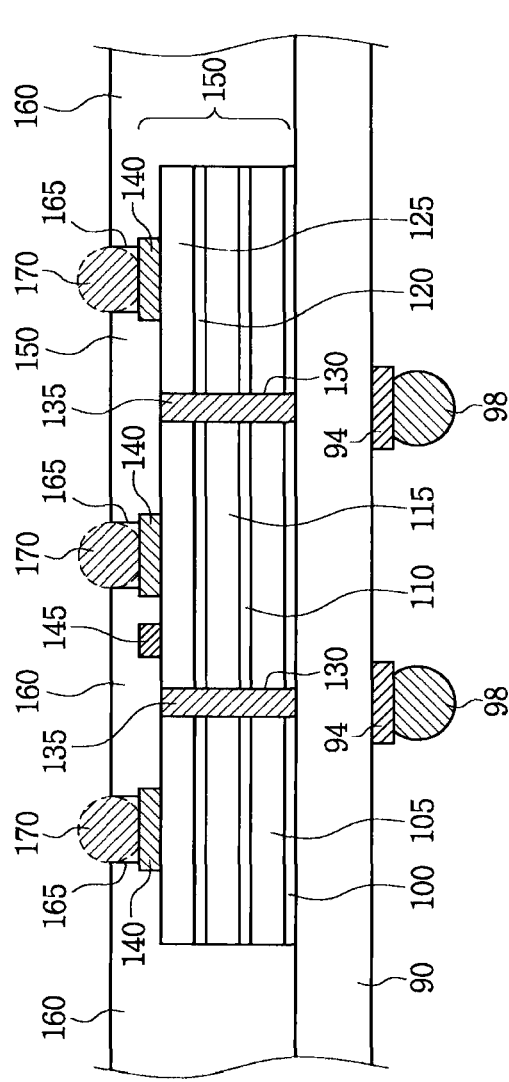

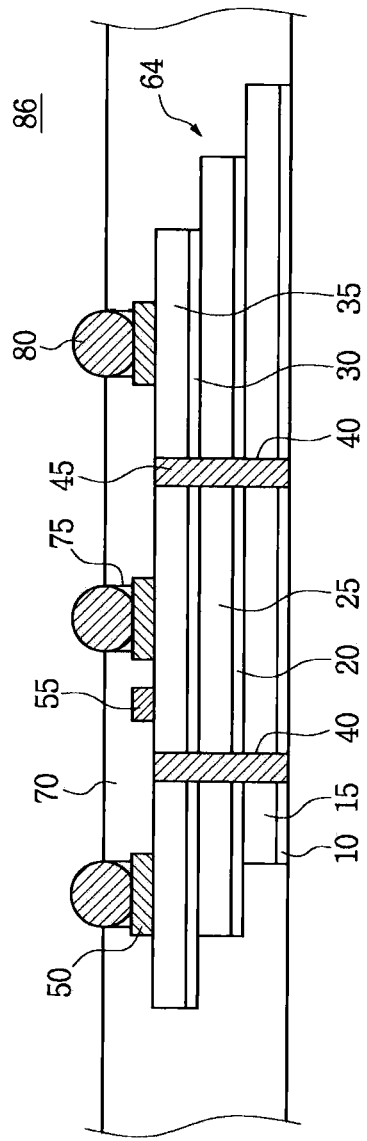
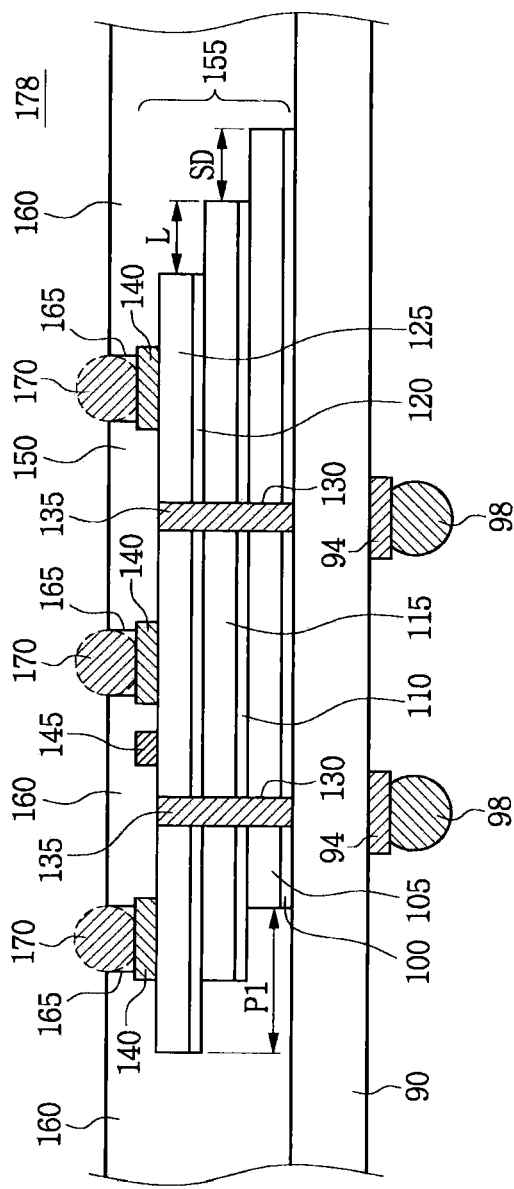

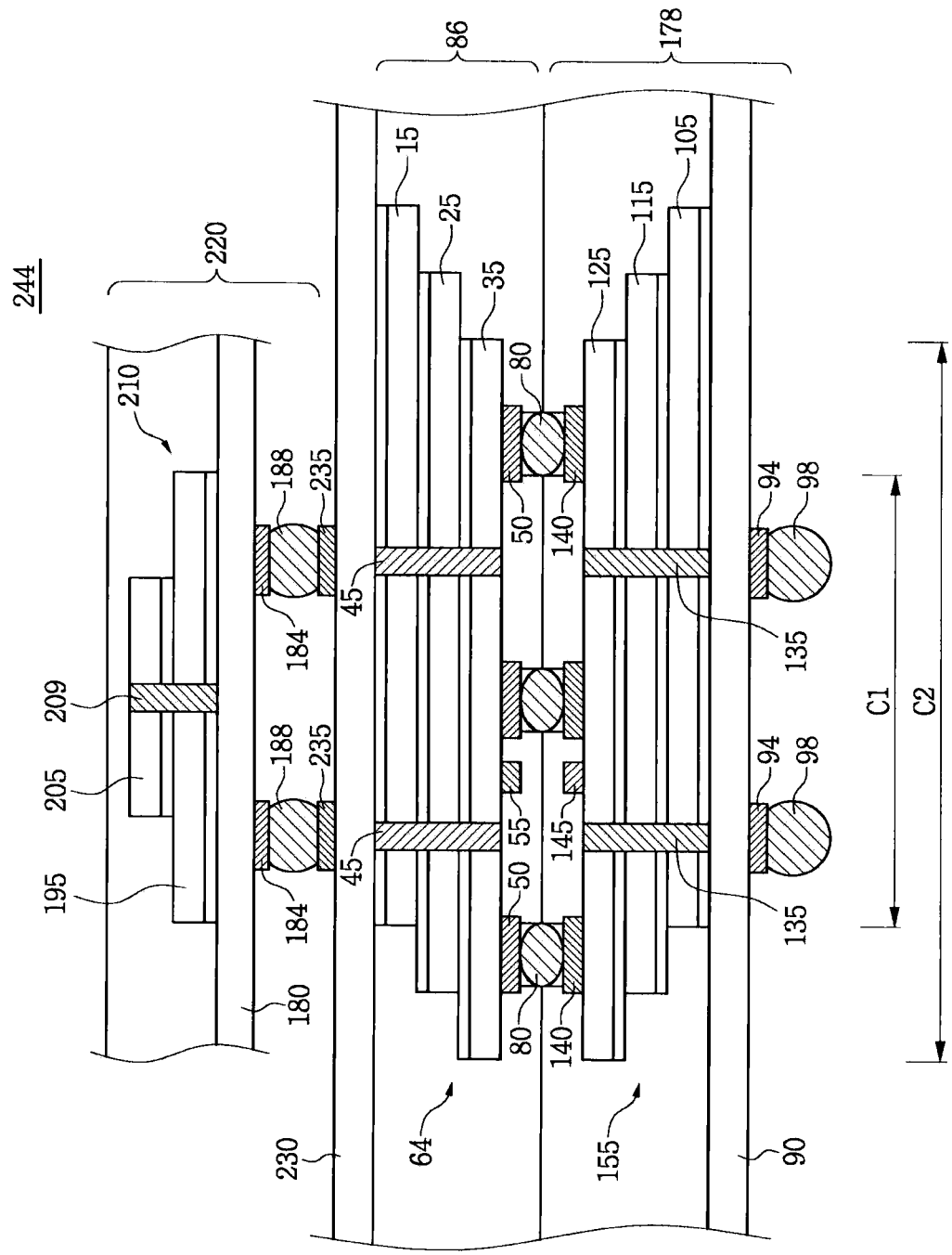

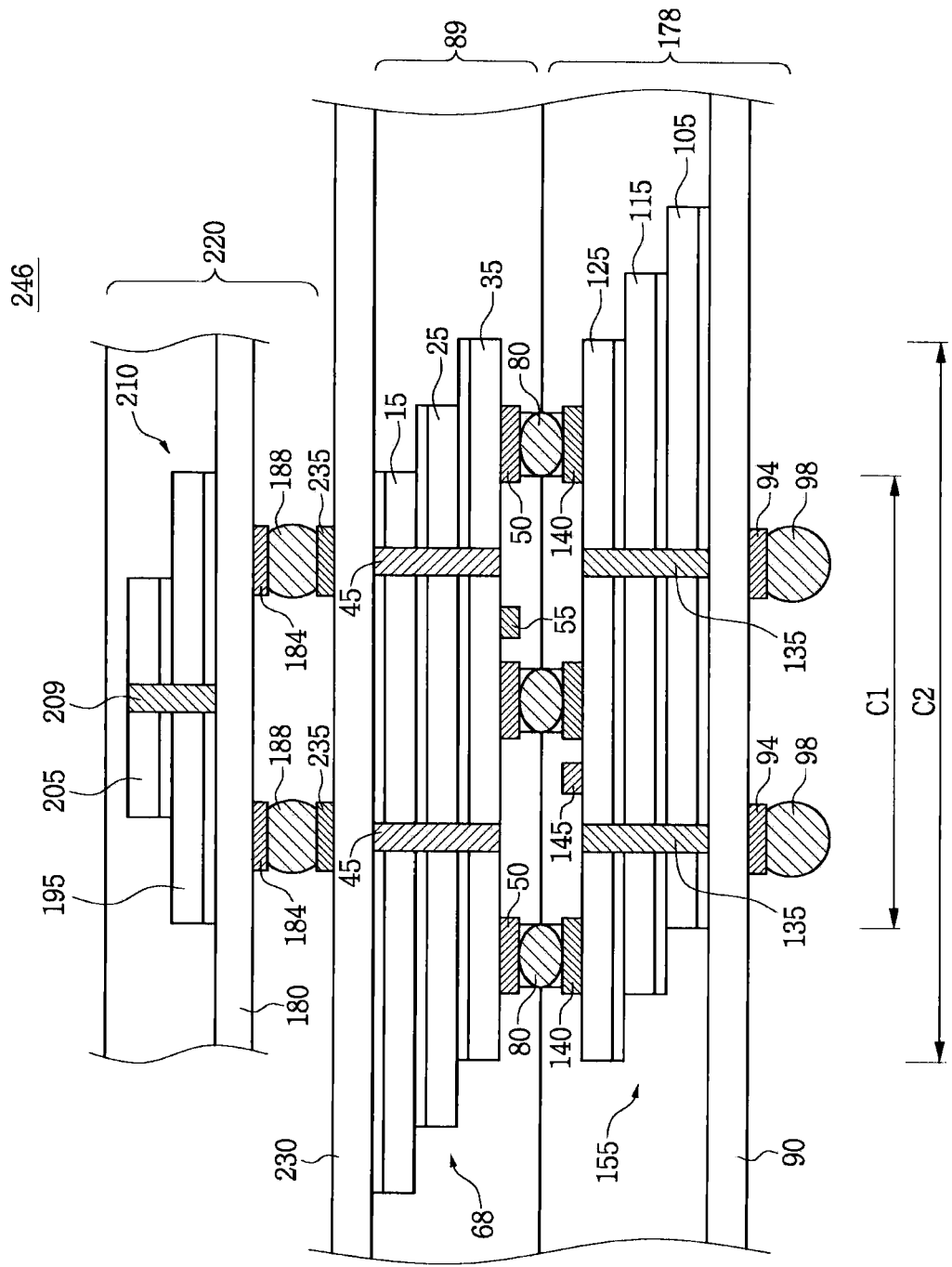

SEMICONDUCTOR PACKAGE STRUCTURE HAVING PLURAL PACKAGES IN A STACKED ARRANGEMENT

CROSS-REFERENCE TO RELATED APPLICATION

This application claims the benefit of priority under 35 U.S.C. §119 from Korean Patent Application No. 10-2009-0100892, filed on Oct. 22, 2009, the contents of which are hereby incorporated herein by reference in its entirety.

BACKGROUND

1. Field

Example embodiments relate to a semiconductor package structure.

2. Description of Related Art

Currently, a semiconductor package structure is fabricated by sequentially stacking a lower package and an upper package to embody high integration thereof. The lower package has a lower chip stacked structure on a lower printed circuit board. The upper package has an upper chip stacked structure on an upper printed circuit board. Each of the lower and upper chip stacked structures has sequentially stacked semiconductor chips. As a result, the semiconductor package structure has a lower printed circuit board, a lower chip stacked structure, an upper printed circuit board and an upper chip stacked structure, which are sequentially stacked.

In such a case, the semiconductor package structure has the upper printed circuit board between the lower chip stacked structure and the upper chip stacked structure, and thus there may be a limit in a process to embody the high integration of the semiconductor package structure. This is because the upper printed circuit board may dispose between the lower chip stacked structure and the upper chip stacked structure to not facilitate a reduction in thickness of the semiconductor package structure. In addition, the semiconductor package structure has the lower chip stacked structure between the lower printed circuit board and the upper printed circuit board, and thus there may be a limit in a process to embody the high integration of the semiconductor package structure.

This is because the lower chip stacked structure may have a limited space between the lower printed circuit board and the upper printed circuit board by increasing the stacked number of semiconductor chips, which can increase a process failure rate. Therefore, the semiconductor package structure may not have a process margin for the high integration thereof, and thus it may not satisfy the trend of multi-functionalization.

SUMMARY

Example embodiments provide a semiconductor package structure capable of reducing the overall thickness to embody higher integration of the semiconductor package structure.

Example embodiments also provide a semiconductor package structure capable of reducing a process failure rate and increasing a process margin to embody multi-functionalization.

Example embodiments further provide a semiconductor package structure that does not have a printed circuit board between adjacent lower and middle chip stacked structures to embody higher integration of the semiconductor package structure.

Example embodiments moreover provide a semiconductor package structure that does not have a printed circuit board between lower and middle chip stacked structures to embody high integration of the semiconductor package structure, and has two printed circuit boards between middle and upper chip stacked structures.

According to example embodiments, a semiconductor package structure includes first and second packages. The first package has at least one first semiconductor chip disposed on a first printed circuit board, and at least one first pad disposed on the at least one first semiconductor chip. The second package has at least one second pad disposed on the first package, and at least one second semiconductor chip disposed on the at least one second pad. The at least one first semiconductor chip is electrically connected to the first printed circuit board. The at least one second pad is electrically connected to the at least one second semiconductor chip. The at least one second pad faces the at least one first pad.

In example embodiments, the structure further includes a second printed circuit board disposed on the second package, a third package having at least one third semiconductor chip disposed on the second printed circuit board, and at least one third pad disposed on the at least one third semiconductor chip. The structure also includes a fourth package having at least one fourth pad disposed on the third package, and at least one fourth semiconductor chip disposed on the at least one fourth pad. The second printed circuit board is electrically connected to the second package, the at least one fourth pad is electrically connected to the at least one fourth semiconductor chip, and the at least one fourth pad faces the at least one third pad.

In example embodiments, the structure further includes at least one first solder ball disposed on the second package and at least one second solder ball disposed on the fourth package. The at least one first pad and the at least one second pad are in contact with the at least one first solder ball, and the at least one third pad and the at least one fourth pad are in contact with the at least one second solder ball.

In example embodiments, the at least one first pad is electrically connected to the at least one first semiconductor chip, and the at least one third pad is electrically connected to the at least one third semiconductor chip.

In example embodiments, the structure further includes a second printed circuit board and a third package, with the second printed circuit board and the third package stacked sequentially on the second package. The second package is electrically connected to the third package through the second printed circuit board.

In example embodiments, a semiconductor package structure includes first and second packages. The first package includes at least one first connection, where the at least one first connection and the at least one first pad are disposed at a same level on the at least one first semiconductor chip. The second package includes at least one first solder ball disposed on the first package and at least one second connection, where the at least one second connection and the at least one second pad are disposed on the at least one first solder ball and arranged at a same level, and the at least one second semiconductor chip is disposed on the at least one second connection and the at least one second pad. The at least one first semiconductor chip is electrically connected to the at least one first solder ball and the at least one second connection, and the at least one first pad faces the at least one first solder ball.

In example embodiments, the structure further includes a second printed circuit board disposed on the second package, a third package and a fourth package. The third package has at least one third semiconductor chip disposed on the second printed circuit board, at least one third connection and at least one third pad, where the at least one third connection and the at least one third pad are disposed on the at least one third semiconductor chip and arranged at a same level. The fourth package has at least one second solder ball disposed on the third package, at least one fourth connection and at least one fourth pad, where the at least one fourth connection and the at least one fourth pad are disposed on the at least one second solder ball and arranged at a same level, and at least one fourth semiconductor chip disposed on the at least one fourth connection and the at least one fourth pad. The at least one third semiconductor chip is electrically connected to the second printed circuit board, the at least one second solder ball and the at least one fourth connection, the at least one fourth pad is electrically connected to the at least one fourth semiconductor chip, and the at least one third pad faces the at least one second solder ball.

In example embodiments, the at least one first semiconductor chip includes a plurality of first semiconductor chips sequentially stacked on the first printed circuit board, and the plurality of first semiconductor chips including two sides of the plurality of first semiconductor chips disposed across one of a same region and different regions such that at least one of the two sides of the plurality of first semiconductor chips is exposed. The at least one second semiconductor chip includes a plurality of second semiconductor chips sequentially stacked on the plurality of first semiconductor chips, and the plurality of second semiconductor chips including two sides of the plurality of second semiconductor chips disposed across one of a same region and different regions such that at least one of the two sides of the plurality of second semiconductor chips is exposed.

In example embodiments, the structure further includes the at least one third semiconductor chip includes a plurality of third semiconductor chips sequentially stacked on the second printed circuit board, and the plurality of third semiconductor chips including two sides of the plurality of third semiconductor chips disposed across one of a same region and different regions such that at least one of the two sides of the plurality of third semiconductor chips is exposed. The at least one fourth semiconductor chip includes a plurality of fourth semiconductor chips sequentially stacked on the plurality of third semiconductor chips, and the plurality of fourth semiconductor chips including two sides of the plurality of fourth semiconductor chips disposed across one of a same region and different regions such that at least one of the two sides of the plurality of fourth semiconductor chips is exposed.

In example embodiments, the at least one first connection and the at least one first pad face the at least one second connection and the at least one second pad. The at least one first solder ball is in contact with the at least one first pad and the at least one second pad. The at least one third connection and the at least one third pad face the at least one fourth connection and the at least one fourth pad. The at least one second solder ball is in contact with the at least one third pad and the at least one fourth pad.

In example embodiments, the at least one first pad is electrically connected to at least one of the plurality of first semiconductor chips. The at least one third pad is electrically connected to at least one of the plurality of third semiconductor chips. A part of the at least one first connection is in contact with the at least one first pad. A part of the at least one second connection is in contact with the at least one second pad. A part of the at least one third connection is in contact with the at least one third pad. A part of the at least one fourth connection is in contact with the at least one fourth pad.

In example embodiments, the at least one first semiconductor chip includes at least one first via. The at least one first via penetrates the plurality of first semiconductor chips to electrically connect the plurality of first semiconductor chips to each other, and the remaining part of the at least one first connections is in contact with the at least one first via. The at least one second semiconductor chip includes at least one second via. The at least one second via penetrates the plurality of second semiconductor chips to electrically connect the plurality of second semiconductor chips to each other, and the remaining part of the at least one second connections is in contact with the at least one second via.

In example embodiments, the at least one third semiconductor chip includes at least one third via. The at least one third via penetrates the plurality of third semiconductor chips to electrically connect the plurality of third semiconductor chips to each other, and the remaining part of the at least one third connections is in contact with the at least one third via. The at least one fourth semiconductor chip includes at least one fourth via. The at least one fourth via penetrates the plurality of fourth semiconductor chips to electrically connect the plurality of fourth semiconductor chips to each other, and the remaining part of the at least one fourth connections is in contact with the at least one fourth via.

In example embodiments, the structure further includes a second printed circuit board and a third package. The second printed circuit and the third package are sequentially stacked on the second package, and the second package is electrically connected to the third package through the second printed circuit board.

In example embodiments, the structure further includes a third printed circuit board and a fifth package. The third printed circuit board and the fifth package are sequentially stacked on the fourth package, and the fourth package is electrically connected to the fifth package through the third printed circuit board.

According to example embodiments, a semiconductor package structure includes a first package, a second package, a second printed circuit board and a third package. The first package has at least one first semiconductor chip disposed on a first printed circuit board, and at least one first pad disposed on the at least one first semiconductor chip. The second package has at least one second pad disposed on the first package, and at least one second semiconductor chip disposed on the at least one second pad.

The second printed circuit board and the third package are sequentially stacked on the second package. The first and second packages are electrically connected to each other through the at least one first pad and the at least one second pad. The at least one second pad is electrically connected to the second semiconductor chips to face the at least one first pad. The second package is electrically connected to the third package through the second printed circuit board.

In example embodiments, the at least one first semiconductor chip includes a plurality of first semiconductor chips sequentially stacked on the first printed circuit board. The plurality of first semiconductor chips includes two sides of the plurality of first semiconductor chips disposed across one of a same region and different regions such that at least one of the two sides of the plurality of first semiconductor chips is exposed. The at least one second semiconductor chip includes a plurality of second semiconductor chips sequentially stacked on the plurality of first semiconductor chips. The plurality of second semiconductor chips including two sides of the plurality of second semiconductor chips disposed across one of a same region and different regions such that at least one of the two sides of the plurality of second semiconductor chips is exposed.

In example embodiments, the structure further includes at least one first solder ball disposed in the second package. The at least one first solder ball is in contact with the at least one first pad and the at least one second pad.

In example embodiments, the first printed circuit board has a controller electrically connected to the plurality of first semiconductor chips. The plurality of first semiconductor chips are electrically connected to each other through wires disposed in the exterior of the plurality of first semiconductor chips. The wires are electrically connected to the first printed circuit board. The plurality of second semiconductor chips include at least one second via that penetrates the plurality of second semiconductor chips to electrically connect the plurality of second semiconductor chips. The at least one second via is in contact with the second printed circuit board.

In example embodiments, the at least one first pad is electrically connected to at least one of the plurality of first semiconductor chips. The second printed circuit board includes at least one third pad. The third package includes a third printed circuit board and at least one third semiconductor chip electrically connected to each other. The third printed circuit board includes at least one second solder ball and at least one fourth pad stacked sequentially. The at least one second solder ball is in contact with the at least one third pad and the at least one fourth pad.

According to example embodiments, the semiconductor package structure includes a first package, a second package and a second printed circuit board. The first package includes at least one first semiconductor chip disposed on a first printed circuit board and at least one first pad disposed on the at least one first semiconductor chip. The second package including at least one second semiconductor chip. The second printed circuit board is not disposed between the at least one first semiconductor chip and the at least one at least one second semiconductor chip.

In example embodiments, the structure further includes at least one first solder ball. The second package further includes at least one second pad disposed on the first package and the at least one second semiconductor chip disposed on the at least one second pad. The at least one first solder ball is in contact with at least one first pad and the at least one second pad.

In example embodiments, the at least one first semiconductor chip includes a plurality of first semiconductor chips stacked sequentially. The at least one second semiconductor chip includes a plurality of second semiconductor chips stacked sequentially. At least one of the plurality of first and second semiconductor chips is stacked in a staggered arrangement.

In example embodiments, the at least one first pad is electrically connected to the at least one first semiconductor chip. The at least one second pad is electrically connected to the at least one second semiconductor chip.

BRIEF DESCRIPTION OF THE DRAWINGS

Example embodiments are described in further detail below with reference to the accompanying drawings. It should be understood that various aspects of the drawings may have been exaggerated for clarity.

FIGS. 3 to 8 are cross-sectional views taken along line I-I' of FIG. 1, illustrating a method of forming a semiconductor package structure according to example embodiments.

FIGS. 9 to 13 are cross-sectional views taken along line I-I' of FIG. 1, illustrating another method of forming a semiconductor package structure according to example embodiments.

FIGS. 14 and 15 are cross-sectional views taken along line I-I' of FIG. 1, illustrating yet another method of forming semiconductor package structures according to example embodiments.

DETAILED DESCRIPTION

Figure 1:
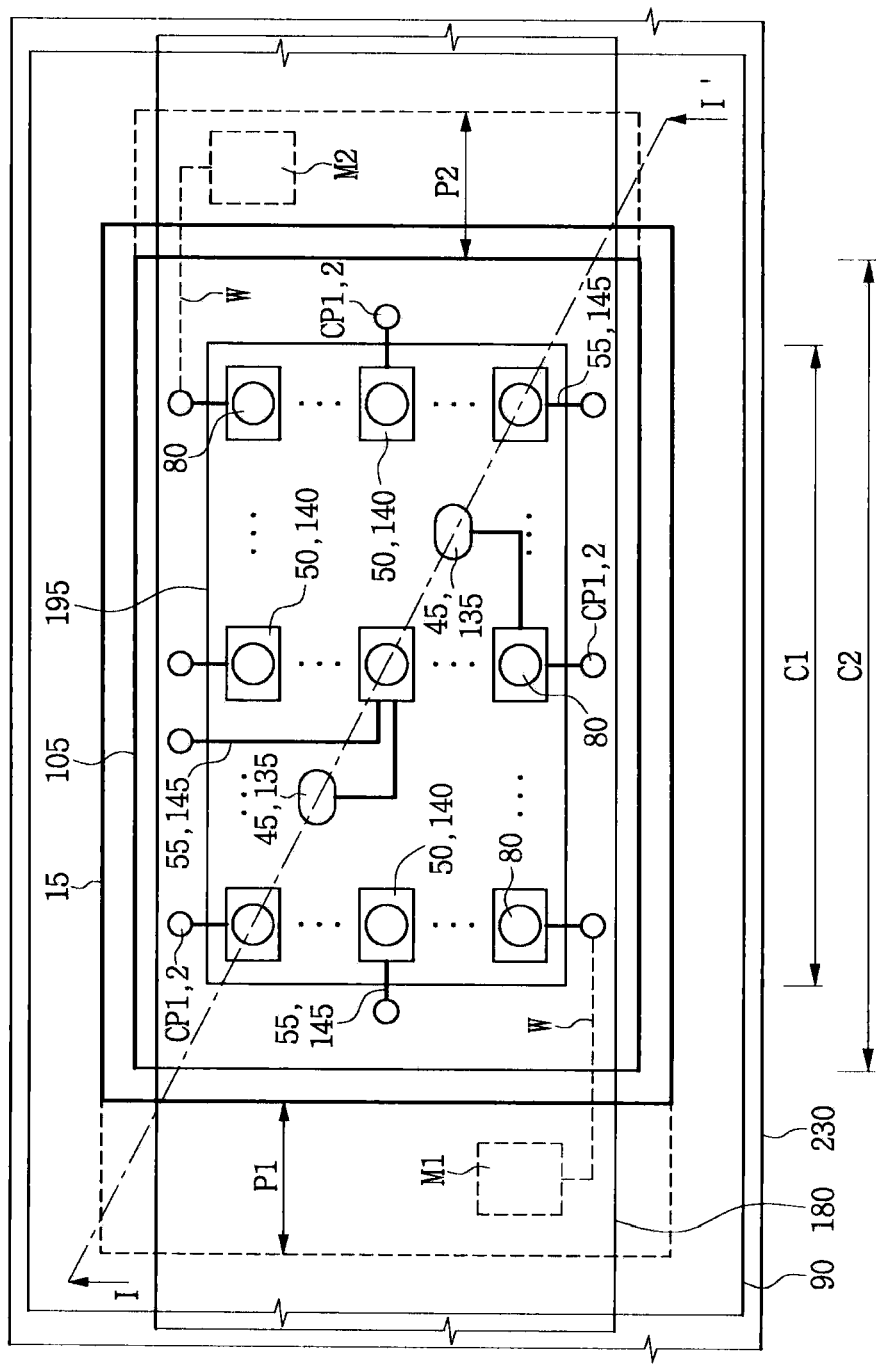
FIG. 1 is a plan view showing semiconductor package structures according to example embodiments.

Example embodiments will now be described more fully with reference to the accompanying drawings. Example embodiments of the inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. It will be understood that although the terms, such as "first to third packages," "lower and upper semiconductor chips," "first to third printed circuit boards," "lower and upper via holes," "lower and upper through silicon vias," and "pads" and the like, are used herein to describe various elements, the elements should not be limited by these terms. These terms are only used to distinguish one element from another element. For example, a first element could be termed a second element, and, similarly, a second element could be termed a first element, without departing from the scope of embodiments of the inventive concept. As used herein, the term "and/or" includes any and all combinations of one or more of the associated listed items.

Spatially relative terms, such as "at least one of," "below," "selected," "a part of," "remaining," "around," "over," "lower portion," and the like, may be used herein for ease of description to describe one element or feature's relationship to another element(s) or feature(s) as illustrated in the figures. The terminology used herein is for the purpose of describing example embodiments only and is not intended to be limiting of the inventive concept. The accompanying figures are not to be considered as drawn to scale unless explicitly noted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of embodiments of the inventive concept. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Embodiments of the inventive concept are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of embodiments of the inventive concept.

Unless otherwise defined, all terms (including technical and scientific terms) used herein have the same meaning as commonly understood by one of ordinary skill in the art to which embodiments of the inventive concept belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of embodiments of the inventive concept unnecessarily ambiguous, the detailed description thereof will be omitted. Also, terms used herein are defined to appropriately describe embodiments of the inventive concept and thus may be changed depending on a user, the intent of an operator, or a custom. Accordingly, the terms must be defined based on the following overall description within this specification.

Now, a semiconductor package structure according to example embodiments will be described in further detail below with reference to FIGS. 1 and 2.

FIG. 1 is a plan view showing semiconductor package structures according to example embodiments.

Referring to FIG. 1, each of semiconductor package structures 242, 244, 246, and 248 may have a lower semiconductor chip 105. Each of the semiconductor package structures 242, 244, 246, and 248 may have a lower central region C2, a first peripheral region P1, and a second peripheral region P2. The lower semiconductor chip 105 may be at least one in number. The lower semiconductor chip 105 may be disposed in the lower central region C2. The lower semiconductor chip 105 may be disposed in the lower central region C2 and the first peripheral region P1 or in the lower central region C2 and the second peripheral region P2. The lower semiconductor chip 105 may have lower pads 140 and lower reinterconnections 145 in the lower central region C2.

The lower pads 140 and the lower reinterconnections (or connections) 145 may be disposed on a selected surface of the lower semiconductor chip 105. The lower pads 140 may be electrically connected to the lower semiconductor chip 105. The lower reinterconnections 145 may be electrically connected to the lower pads 140. When the lower semiconductor chip 105 has the lower pads 140 and the lower reinterconnections 145, the lower semiconductor chip 105 may have lower through silicon vias 135. The lower through silicon vias 135 may penetrate the lower semiconductor chip 105.

The lower through silicon vias 135 may be electrically connected to the lower pads 140 through the lower reinterconnections 145. A lower printed circuit board 90 may be disposed below the lower semiconductor chip 105. The lower printed circuit board 90 may be electrically connected to the lower through silicon vias 135. The lower semiconductor chip 105 may have the lower pads 140, the lower reinterconnections 145 and a first connection pad CP1 in the lower central region C2.

The first connection pad CP1 may be electrically connected to the lower pads 140 through the lower reinterconnections 145. When the lower semiconductor chip 105 has the first connection pads CP1, the lower printed circuit board 90 may have a first controller M1 or a second controller M2 in the first or second peripheral region P1 or P2.

The first controller M1 or the second controller M2 may be electrically connected to the lower printed circuit board 90. The first controller M1 or the second controller M2 may be electrically connected to a part of the first connection pads CP1 through a wire W. The other first connection pads CP1 may be electrically connected to the lower printed circuit board 90 through other wires (not shown). A middle semiconductor chip 15 may be disposed on the lower semiconductor chip 105. The middle semiconductor chip 15 may have the same shape as or a different shape from the lower semiconductor chip 105.

The middle semiconductor chip 15 may have middle pads 50 and middle reinterconnections 55 on a surface facing the selected surface of the lower semiconductor chip 105. The middle pads 50 may be electrically connected to the middle semiconductor chip 15. The middle reinterconnections 55 may be electrically connected to the middle pads 50. When the middle semiconductor chip 15 has the middle pads 50 and the middle reinterconnections 55, the middle semiconductor chip 15 may have middle through silicon vias 45. The middle through silicon vias 45 may penetrate the middle semiconductor chip 15.

The middle through silicon vias 45 may be electrically connected to the middle pads 50 through the middle reinterconnections 55. The middle pads 50 may be electrically connected to the lower pads 140 through solder balls 80. A middle printed circuit board 230 may be disposed on the middle semiconductor chip 15. The middle printed circuit board 230 may be electrically connected to the middle through silicon vias 45. The middle printed circuit board 230 may have the same shape as or a different shape from the lower printed circuit board 90.

The middle semiconductor chip 15 may have the middle pads 50, the middle reinterconnections 55 and second connection pads CP2 in the lower central region C2. The second connection pads CP2 may be electrically connected to the middle pads 50 through the middle reinterconnections 55. When the middle semiconductor chip 15 has the second connection pads CP2, the middle printed circuit board 230 may have the first controller M1 or the second controller M2 in the first peripheral region P1 or the second peripheral region P2. The first controller M1 or the second controller M2 may be electrically connected to the middle printed circuit board 230. The first controller M1 or the second controller M2 may be electrically connected to a part of the second connection pads CP2 through the wire W.

The other second connection pads CP2 may be electrically connected to the middle printed circuit board 230 through other wires (not shown). An upper printed circuit board 180 may be disposed on the middle printed circuit board 230. The upper printed circuit board 180 may be electrically connected to the middle printed circuit board 230. The upper printed circuit board 180 may have the same shape as or a different shape from the middle printed circuit board 230.

The upper printed circuit board 180 may have the same component as or different components from the middle printed circuit board 230. The upper printed circuit board 180 may have an upper semiconductor chip 195 in the lower central region C2 or the upper central region C1. The upper semiconductor chip 195 may be at least one in number. The upper semiconductor chip 195 may have the same shape as or a different shape from the lower semiconductor chip 105 and the middle semiconductor chip 15.

Figure 2:
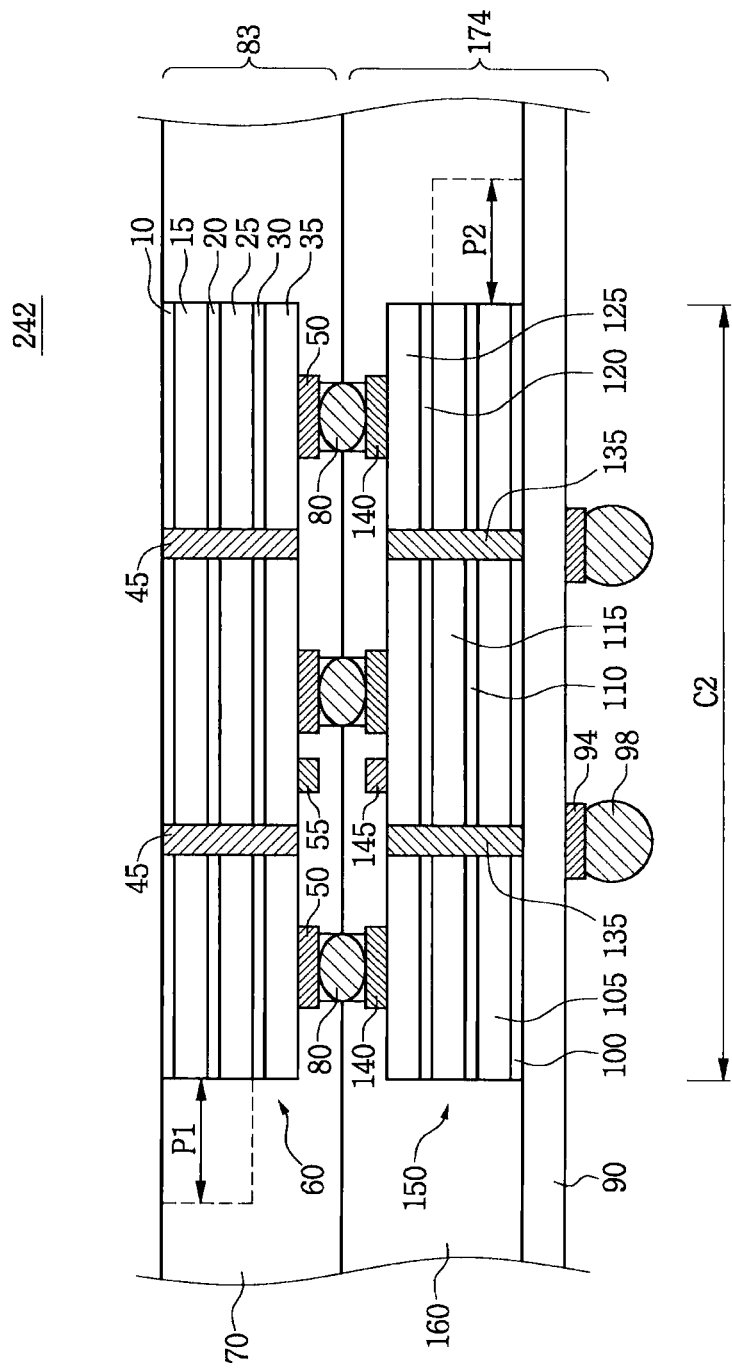
FIG. 2 is a cross-sectional view showing a semiconductor package structure taken along line I-I' of FIG. 1.

FIG. 2 is a cross-sectional view showing a semiconductor package structure taken along line I-I' of FIG. 1.

Referring to FIG. 2, a semiconductor package structure 242 according to example embodiments may include a lower package 174. The lower package 174 may have a lower printed circuit board 90, a lower chip stacked structure 150 and a lower protection layer 160. The lower printed circuit board 90 may have a lower circuit part (not shown), external connection pads 94 and external connection solder balls 98. The lower circuit part may have semiconductor discrete devices and conductive lines. The conductive lines may be electrically connected to the semiconductor discrete devices.

The external connection pads 94 may be disposed below the lower printed circuit board 90 to be electrically connected to the lower circuit part. The external connection solder balls 98 may be electrically connected to the lower circuit part through the external connection pads 94. The lower chip stacked structure 150 may be disposed on the lower printed circuit board 90. The lower chip stacked structure 150 may have first to third lower adhesives 100, 110 and 120, first to third lower semiconductor chips 105, 115 and 125, lower through silicon vias 135, lower pads 140 and lower reinterconnections 145.

The first to third lower adhesives 100, 110 and 120 may be correspondingly disposed below the first to third lower semiconductor chips 105, 115 and 125. The first to third lower semiconductor chips 105, 115 and 125 may be disposed in the lower central region C2 of the semiconductor package structure 242. The first to third lower semiconductor chips 105, 115 and 125 may be the same semiconductor device or different semiconductor devices. Each of the first to third lower semiconductor chips 105, 115 and 125 may have both sides disposed across generally a same region.

The first to third lower semiconductor chips 105, 115 and 125 may extend from the lower central region C2 to the second peripheral region P2. In such a case, the first to third lower semiconductor chips 105, 115 and 125 may expose each other through both sides. The lower through silicon vias 135 may penetrate the first to third lower adhesives 100, 110 and 120 and the first to third lower semiconductor chips 105, 115 and 125 to be electrically connected to the lower printed circuit board 90. The lower through silicon vias 135 may have the same shape as or a different shape from that illustrated in FIG. 2.

The lower through silicon vias 135 may be replaced by the wires of FIG. 1. The wires may electrically connect the first to third lower semiconductor chips 105, 115 and 125 through the exterior of the first to third lower semiconductor chips 105, 115 and 125. When the lower through silicon vias 135 are replaced by the wires, the lower printed circuit board 90 may have the first controller M1 or the second controller M2 of FIG. 1. The lower printed circuit board 90 may be electrically connected to the first to third lower semiconductor chips 105, 115 and 125 through the wires, the connection pads CP1, and the first controller M1 of FIG. 1.

The lower printed circuit board 90 may be electrically connected to the first to third lower semiconductor chips 105, 115 and 125 through the wires, the connection pads CP1, and the second controller M2 of FIG. 1. The lower pads 140 and the lower reinterconnections 145 may be disposed on the third lower semiconductor chip 125 to be on the same level. The lower pads 140 and the lower reinterconnections 145 may have the same shape as or a different shape from that illustrated in FIG. 1. The lower pads 140 may be electrically connected to the third lower semiconductor chip 125. The lower pads 140 may be electrically connected to the lower through silicon vias 135 through the lower reinterconnections 145. The lower protection layer 160 may be disposed on the lower printed circuit board 90 to cover the lower chip stacked structure 150.

The lower protection layer 160 may expose the lower pads 140. A middle package 83 may be disposed on the lower protection layer 160. The middle package 83 may have a middle chip stacked structure 60 and a middle protection layer 70. The middle chip stacked structure 60 may have first to third middle adhesives 10, 20 and 30, first to third middle semiconductor chips 15, 25 and 35, middle through silicon vias 45 and middle pads 50. The first to third middle adhesives 10, 20 and 30 may be disposed on the first to third middle semiconductor chips 15, 25 and 35.

The first to third middle semiconductor chips 15, 25 and 35 may be disposed in the lower central region C2 of the semiconductor package structure 242. The first to third middle semiconductor chips 15, 25 and 35 may be the same as or different from the first to third lower semiconductor chips 105, 115 and 125. Each of the first to third middle semiconductor chips 15, 25 and 35 may have both sides disposed across generally a same region. Alternatively, the first to third middle semiconductor chips 15, 25 and 35 may extend from the lower central region C2 to the first peripheral region P1.

In such a case, the first to third middle semiconductor chips 15, 25 and 35 may be become exposed on both sides due to the first to third middle semiconductor chips 15, 25 and 35 being stacked in a staggered arrangement. The first to third middle semiconductor chips 15, 25 and 35 may extend from the lower central region C2 to a second peripheral region P2. The first to third lower semiconductor chips 105, 115 and 125 may extend from the lower central region C2 to the first peripheral region P1. The middle through silicon vias 45 may penetrate the first to third middle adhesives 10, 20 and 30 and the first to third middle semiconductor chips 15, 25 and 35.

The middle through silicon vias 45 may have the same shape as or a different shape from that illustrated in FIG. 2. The middle through silicon vias 45 may be replaced by the wires of FIG. 1. The wires may electrically connect the first to third middle semiconductor chips 15, 25 and 35 through the exterior of the first to third middle semiconductor chips 15, 25 and 35. The middle pads 50 and the middle reinterconnections 55 may be disposed on the third middle semiconductor chip 35 to be at a same level. The middle pads 50 may be electrically connected to the third middle semiconductor chip 35.

The middle pads 50 may be electrically connected to the middle through silicon vias 45 through the middle reinterconnections 55. The middle pads 50 and the middle reinterconnections 55 may have the same shape as or a different shape from that illustrated in FIG. 1. The middle pads 50 may face the lower pads 140. The middle reinterconnections 55 may face or partially overlap the lower reinterconnections 145. The middle protection layer 70 may surround the middle chip stacked structure 60. The middle protection layer 70 may expose the first middle adhesive 10.

The middle protection layer 70 may have middle solder balls 80. The middle solder balls 80 may be in contact with the middle pads 50 through the middle protection layer 70. The middle solder balls 80 may protrude from a top surface of the middle protection layer 70 to be in contact with the lower pads 140. In such a case, the lower and middle packages 174 and 83 do not have a printed circuit board between the lower and middle protection layers 160 and 70. The lower and middle packages 174 and 83 may reduce the overall thickness of the semiconductor package structure 242 to embody higher integration of the semiconductor package structure 242.

Since the first to third lower semiconductor chips 15, 25 and 35 and the first to third middle semiconductor chips 105, 115 and 225 are not in direct contact with each other by the lower and middle packages 174 and 83, a process failure rate may be reduced and the degree of freedom related to fixing margin between packages may be increased.

Figure 8:
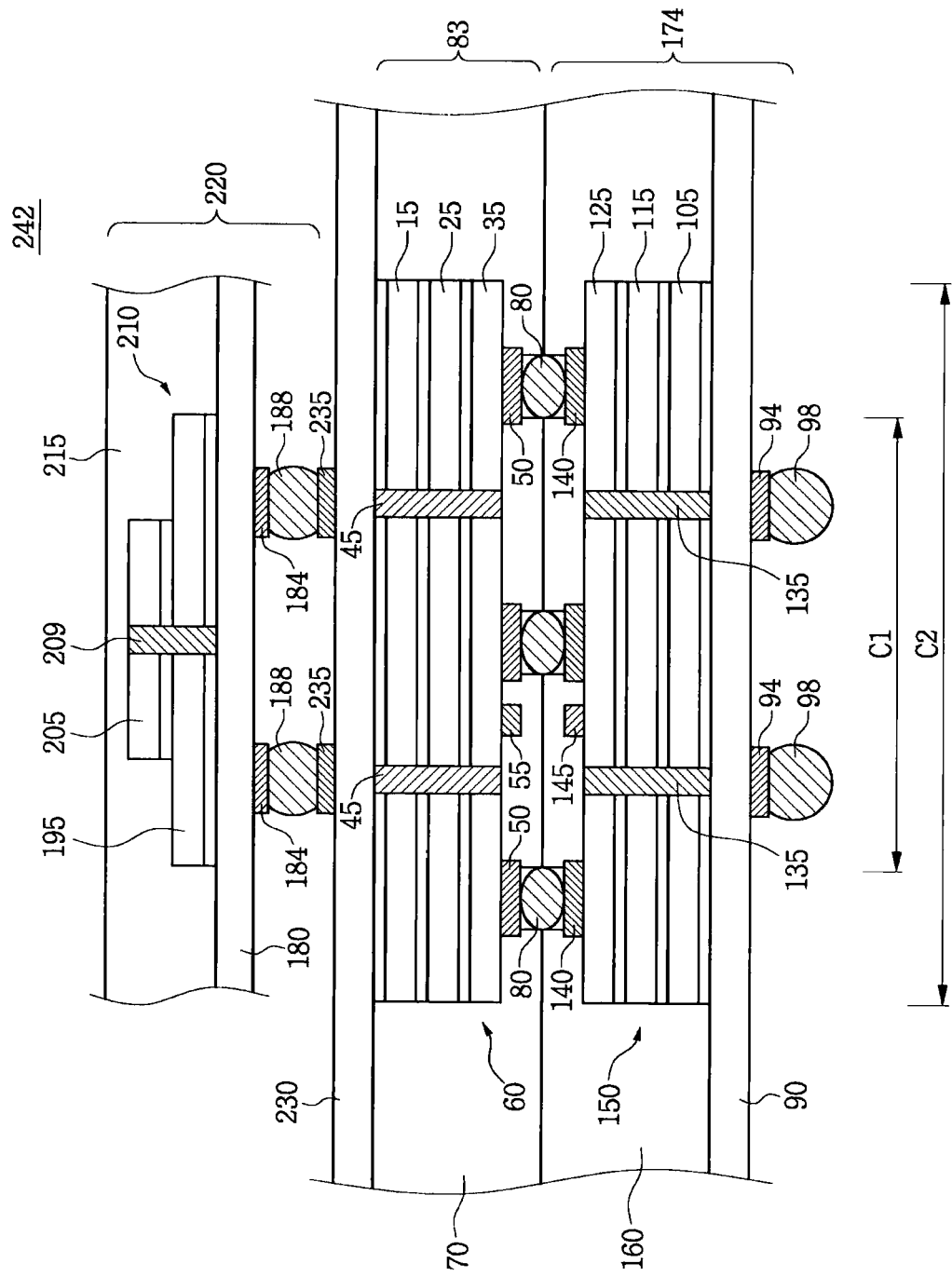

Referring to FIG. 8, a middle printed circuit board 230 may be disposed on the middle protection layer 70 and the first middle adhesive 10. The middle printed circuit board 230 may have a middle circuit part (not shown) and internal connection pads 235. The middle circuit part may be the same as or different from the lower circuit part of the lower printed circuit board 90. The internal connection pads 235 may be disposed on the middle printed circuit board 230 to be electrically connected to the middle circuit part. A unit of the middle printed circuit board 230 and the lower and middle packages 174 and 83 may be stacked at least once in a repeated manner. In this case, the external connection solder balls 98 of the lower package 174 may be in contact with the internal connection pads 235 of the middle printed circuit board 230.

When the middle through silicon vias 45 are replaced by the wires of FIG. 1, the middle printed circuit board 230 may have the first controller M1 or the second controller M2 of FIG. 1. The middle printed circuit board 230 may be electrically connected to the first to third middle semiconductor chips 15, 25 and 35 through the wires, the second connection pads CP2, and the first controller M1 of FIG. 1. The middle printed circuit board 230 may also be electrically connected to the first to third middle semiconductor chips 15, 25 and 35 through the wires, the second connection pads CP2, and the second controller M2 of FIG. 1. An upper package 220 of FIG. 8 may be disposed on the middle printed circuit board 230. The upper package 220 may have an upper printed circuit board 180, an upper chip stacked structure 210 and an upper protection layer 215.

The upper printed circuit board 180 may have an upper circuit part (not shown), upper pads 184 and upper solder balls 188. The upper circuit part may be the same as or different from the middle circuit part. The upper pads 184 may be disposed below the upper printed circuit board 180 to be electrically connected to the upper circuit part. The upper pads 184 may face the internal connection pads 235. The upper solder balls 188 may be in contact with the internal connection pads 235 and the upper pads 184.

The upper chip stacked structure 210 may have first and second upper adhesives 190 and 200, first and second upper semiconductor chips 195 and 205, and an upper through silicon via 209. The first and second upper adhesives 190 and 200 may be disposed below the first and second upper semiconductor chips 195 and 205. The first and second upper semiconductor chips 195 and 205 may be disposed in an upper central region C1 of the semiconductor package structure 242. The first and second upper semiconductor chips 195 and 205 may be the same semiconductor device or different semiconductor devices.

The first and second upper semiconductor chips 195 and 205 may be different from the first to third middle semiconductor chips 15, 25 and 35. Each of the first and second upper semiconductor chips 195 and 205 may have both sides disposed across generally a same region or may instead be disposed across different regions such at least one of the both sides is exposed due to the first and second middle semiconductor chips 195 and 205 being stacked in a staggered arrangement. The upper through silicon via 209 may be at least one in number. The upper through silicon via 209 may penetrate the first and second upper adhesives 190 and 200 and the first and second upper semiconductor chips 195 and 205.

The first and second upper semiconductor chips 195 and 205 may be electrically connected to each other through the upper through silicon via 209. The upper through silicon via 209 may be in contact with the upper circuit part of the upper printed circuit board 180. The upper through silicon via 209 may have the same shape as or a different shape from that illustrated in FIG. 2. The upper through silicon via 209 may be replaced by wires (not shown). The wires may electrically connect the first and second upper semiconductor chips 195 and 205 through the exterior of the first and second upper semiconductor chips 195 and 205.

When the upper through silicon vias 209 are replaced by the wires, the upper printed circuit board 180 may have a controller (not shown). The upper printed circuit board 180 may be electrically connected to the first and second upper semiconductor chips 195 and 205 through the wires, the connection pads (not shown) and the controller. The upper protection layer 215 may be formed on the upper printed circuit board 180 to cover the upper chip stacked structure 210.

In such a case, the upper package 220, the lower and middle packages 174 and 83, and the middle printed circuit board 230 may embody multi-functionalization of the semiconductor package structure 242.

Next, a method of forming a semiconductor package structure according to example embodiments will be described with reference to FIGS. 3 to 15.

FIGS. 3 to 8 are cross-sectional views taken along line I-I' of FIG. 1, illustrating a method of forming a semiconductor package structure according to example embodiments. In FIGS. 3 to 8, like reference numerals designate like elements as in FIG. 2.

Referring to FIG. 3, a first middle adhesive 10 and a first middle semiconductor chip 15 may be sequentially formed on a carrier 5 according to example embodiments. The carrier 5 may be a support member of the first middle adhesive 10 and the first middle semiconductor chip 15. The first middle adhesive 10 may include insulating material. The first middle semiconductor chip 15 may include a volatile or non-volatile semiconductor device. A second middle adhesive 20 and a second middle semiconductor chip 25 may be sequentially formed on the first middle semiconductor chip 15.

The second middle adhesive 20 may be the same material as the first middle adhesive 10. The second middle semiconductor chip 25 may be the same as or different from the first middle semiconductor chip 15. Afterwards, a third middle adhesive 30 and a third middle semiconductor chip 35 may be sequentially formed on the second middle semiconductor chip 25. The third middle adhesive 30 may be the same material as the first middle adhesive 10. The third middle semiconductor chip 35 may be the same as or different from the first middle semiconductor chip 15. At least one middle adhesive and at least one middle semiconductor chip may also be sequentially formed on the third middle semiconductor chip 35. Middle via holes 40 may be formed in the first to third middle adhesives 10, 20 and 30 and the first to third middle semiconductor chips 15, 25 and 35.

The middle via holes 40 may penetrate the first to third middle adhesives 10, and 30 and the first to third middle semiconductor chips 15, 25 and 35. Middle through silicon vias 45 may be formed in the middle via holes 40. The middle through silicon vias 45 may electrically connect the first to third middle semiconductor chips 15, 25 and 35 to each other. The middle through silicon vias 45 may include conductive material. Middle pads 50 and middle reinterconnections 55 may be formed on the third middle semiconductor chip 35.

The middle pads 50 and the middle reinterconnections 55 may include conductive material. The middle pads 50 may be electrically connected to the third middle semiconductor chip 35. The middle reinterconnections 55 may be electrically connected to the middle pads 50 and/or the middle through silicon vias 45. As a result, the middle through silicon vias 45 and the middle pads 50 may constitute a first middle chip stacked structure 60 together with the first to third middle adhesives 10, 20 and 30, the first to third middle semiconductor chips 15, 25 and 35 and the middle reinterconnections 55.

Referring to FIGS. 4 and 5, according to example embodiments, a middle protection layer 70 may be formed on the carrier 5 to cover the first middle chip stacked structure 60 as illustrated in FIG. 4. The middle protection layer 70 may include epoxy resin. Laser irradiation may be performed on the middle protection layer 70. Photolithography and etching processes may also be performed on the middle protection layer 70 in stead of the laser irradiation. The laser irradiation, or the photolithography and etching processes may be performed to form middle molding holes 75 in the middle protection layer 70 as illustrated in FIG. 4.

During the performance of the etching process, a dry or wet etchant may be applied to the protection layer 70. The middle molding holes 75 may be formed to expose the middle pads 50. Middle solder balls 80 may be formed in the middle molding holes 75 as illustrated in FIG. 4. The middle solder balls 80 may include conductive material. The middle solder balls 80 may be formed to protrude from a top surface of the middle protection layer 70. The carrier 5 may be removed from the first middle adhesive 10 and the middle protection layer 70 as illustrated in FIG. 5.

The first middle adhesive 10 may be exposed from the middle protection layer 70. As a result, the first middle chip stacked structure 60, the middle protection layer 70 and the middle solder balls 80 may constitute a first middle package 83 as illustrated in FIG. 5.

Referring to FIG. 6, a lower printed circuit board 90 may be prepared according to example embodiments. The lower printed circuit board 90 may have external connection pads 94 and external connection solder balls 98 on a selected surface thereof. The external connection pads 94 and the external connection solder balls 98 may include conductive material. The external connection solder balls 98 may be disposed on the external connection pads 94. A first lower adhesive 100 and a first lower semiconductor chip 105 may be sequentially formed on the lower printed circuit board 90.

The first lower adhesive 100 and the first lower semiconductor chip 105 may be formed on a surface facing the selected surface of the lower printed circuit board 90. The first lower adhesive 100 may include insulating material. The first lower semiconductor chip 105 may include a volatile or nonvolatile semiconductor device. A second lower adhesive 110 and a second lower semiconductor chip 115 may be sequentially formed on the first lower semiconductor chip 105. The second lower adhesive 110 may be the same material as the first lower adhesive 100. The second lower semiconductor chip 115 may be the same as or different from the first lower semiconductor chip 105.

A third lower adhesive 120 and a third lower semiconductor chip 125 may be sequentially formed on the second lower semiconductor chip 115. The third lower adhesive 120 may be the same material as the first lower adhesive 100. The third lower semiconductor chip 125 may be the same as or different from the first lower semiconductor chip 105. At least one lower adhesive and at least one lower semiconductor chip may also be sequentially formed on the third lower semiconductor chip 125. The first to third lower semiconductor chips 105, 115, and 125 may be the same as or different from the first to third middle semiconductor chips 15, 25, and 35. Lower via holes 130 may be formed in the first to third lower adhesives 100, 110 and 120 and the first to third lower semiconductor chips 105, 115 and 125. The lower via holes 130 may penetrate the first to third lower adhesives 100, 110 and 120 and the first to third lower semiconductor chips 105, 115 and 125.

Lower through silicon vias 135 may be formed in the lower via holes 130. The lower through silicon vias 135 may electrically connect the first to third lower semiconductor chips 105, 115, 125 to each other. The lower through silicon vias 135 may include conductive material. Lower pads 140 and lower reinterconnections 145 may be formed on the third lower semiconductor chip 125. The lower pads 140 and the lower reinterconnections 145 may include conductive material. The lower pads 140 may be electrically connected to the third lower semiconductor chip 125.

The lower reinterconnections 145 may be electrically connected to the lower pads 140 and/or the lower through silicon vias 135. As a result, the lower through silicon vias 135 and the lower pads 140 may constitute a first lower chip stacked structure 150 together with the first to third lower adhesives 100, 110 and 120, the first to third lower semiconductor chips 105, 115 and 125 and the lower reinterconnections 145.

The first lower chip stacked structure 150 may be formed on the carrier 5 of FIG. 1. After the formation of the first lower chip stacked structure 150, it may be shifted from the carrier 5 to the lower printed circuit board 90. A lower protection layer 160 may be formed on the lower printed circuit board 90 to cover the first lower chip stacked structure 150. The lower protection layer 160 may include the same material as the middle protection layer 70. Laser irradiation may be performed on the lower protection layer 160. Photolithography and etching processes may also be performed on the lower protection layer 160 in stead of the laser irradiation.

The laser irradiation, or the photolithography and etching processes may be performed to form lower molding holes 165 in the lower protection layer 160. During the performance of the etching process, a dry or wet etchant may be applied to the lower protection layer 160. The lower molding holes 165 may be formed to expose lower pad holes 140. Lower solder balls 170 may be formed in the lower molding holes 165. The lower solder balls 170 may include the same material as the middle solder balls 80. In this case, the lower solder balls 170 may be formed when the middle solder balls 80 are not used. The lower solder balls 170 may include conductive material.

The lower solder balls 170 may be formed to protrude from a top surface of the lower protection layer 160. As a result, the first lower chip stacked structure 150, the lower protection layer 160 and the lower solder balls 170 may constitute a first lower package 174. The lower solder balls 170 may be excluded from the first lower package 174.

Figure 7:
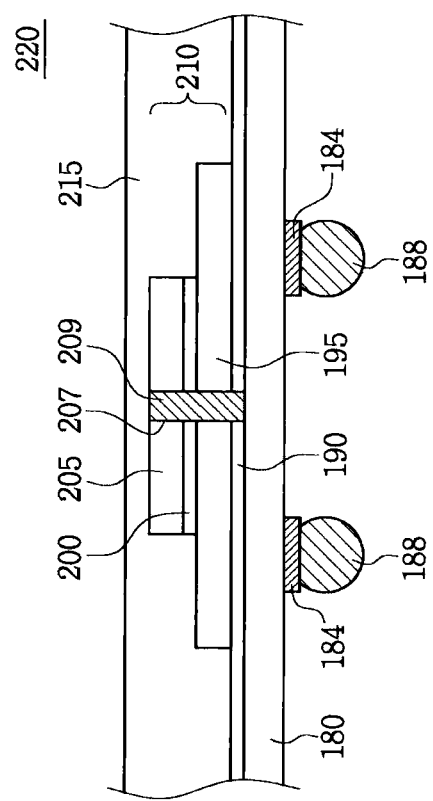

Referring to FIG. 7, an upper printed circuit board 180 may be prepared according to example embodiments. The upper printed circuit board 180 may have upper pads 184 and upper solder balls 188 on a selected surface thereof. The upper pads 184 and the upper solder balls 188 may include conductive material. A first upper adhesive 190 and a first upper semiconductor chip 195 may be sequentially formed on the upper printed circuit board 180. The first upper adhesive 190 and the first upper semiconductor chip 195 may be formed on a surface facing the selected surface of the upper printed circuit board 180.

The first upper adhesive 190 may include insulating material. The first upper semiconductor chip 195 may be a volatile or non-volatile semiconductor device. A second upper adhesive 200 and a second upper semiconductor chip 205 may be sequentially formed on the first upper semiconductor chip 195. The second upper adhesive 200 may be the same material as the first upper adhesive 190. The second upper semiconductor chip 205 may be the same as or different from the first upper semiconductor chip 195. At least one upper adhesive and at least one upper semiconductor chip may also be sequentially formed on the second upper semiconductor chip 205. The first and second upper semiconductor chips 195 and 205 may be different from the first to third lower semiconductor chips 105, 115 and 125.

An upper via hole 207 may be formed in the first and second upper adhesives 190 and 200 and the first and second upper semiconductor chips 195 and 205. The upper via hole 207 may be formed at least one in the first and second upper adhesives 190 and 200 and the first and second upper semiconductor chips 195 and 205. An upper through silicon via 209 may be formed in the upper via hole 207. The upper through silicon via 209 may include conductive material.

The upper through silicon via 209, the first and second upper adhesives 190 and 200 and the first and second upper semiconductor chips 195 and 205 may constitute an upper chip stacked structure 210. The upper chip stacked structure 210 may have at least one reinterconnection (not shown) on the second upper semiconductor chip 205. The upper chip stacked structure 210 may be formed on the carrier of FIG. 1, and then may be shifted to the upper printed circuit board 180 from the carrier 5. An upper protection layer 215 may be formed on the upper printed circuit board 180 to cover the upper chip stacked structure 210. The upper protection layer 215 may include the same material as the middle protection layer 70 of FIG. 4. As a result, the upper protection layer 215 may constitute an upper package 220 together with the upper printed circuit board 180 and the upper chip stacked structure 210.

Referring to FIG. 8, a first middle package 83 of FIG. 5 may be stacked on the first lower package 174 of FIG. 6 according to example embodiments. In such a case, lower and upper parts of the first middle package 83 may be modified as shown in FIG. 8. The middle solder balls 80 of the first middle package 83 may be in contact with the lower pads 140 of the first lower package 174. A middle printed circuit board 230 may be formed on the first middle package 83. The middle printed circuit board 230 may be electrically connected to middle through silicon vias 45. The middle printed circuit board 230 may have internal connection pads 235. An upper package 220 of FIG. 7 may be stacked on the middle printed circuit board 230.

In such a case, upper solder balls 188 of the upper package 220 may be in contact with the internal connection pads 235. As a result, the upper package 220 may constitute a first semiconductor package structure 242 together with the first lower package 174 and the first middle package 83. The first lower chip stacked structure 150 of the first lower package 174, and the first middle chip stacked structure 60 of the first middle package 83 may be formed in a lower central region C2 of the first semiconductor package structure 242. An upper chip stacked structure 210 of the upper package 220 may be formed in the upper central region C1 of the first semiconductor package structure 242.

A unit of the first lower package 174, the first middle package 83 and the middle printed circuit board 230 may be stacked at least once below the upper package 220 in a repeated manner. In such a case, external connection solder balls 98 of the first lower package 174 may be in contact with the internal connection pads 235 of the middle printed circuit board 230.

FIGS. 9 to 13 are cross-sectional views taken along line I-I' of FIG. 1, illustrating a method of forming a semiconductor package structure according to example embodiments. In FIGS. 9 to 13, like reference numerals designate like elements as in FIGS. 3 to 8.

Figure 9:
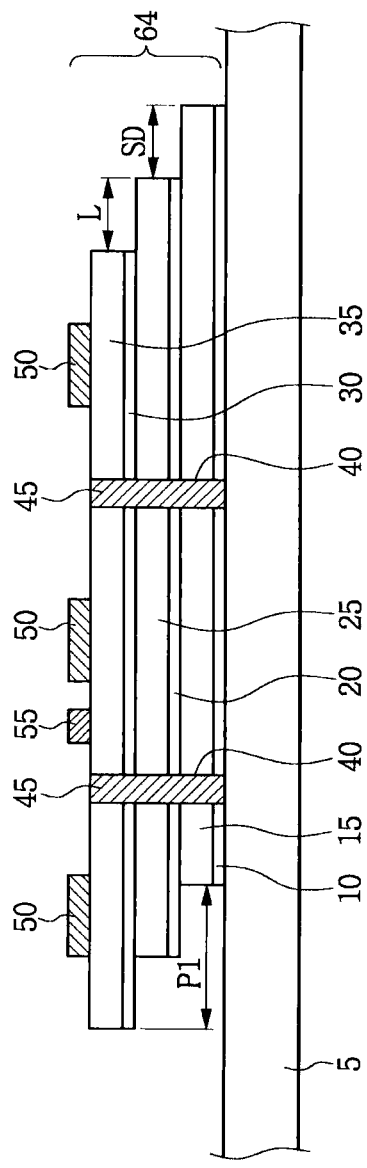

Referring to FIG. 9, a carrier 5 may be prepared according to example embodiments. First to third middle adhesives 10, 20 and 30 and first to third middle semiconductor chips 15, 25 and 35 may be formed on the carrier 5. The first to third middle adhesives 10, 20 and 30 may be formed below the first to third middle semiconductor chips 15, 25 and 35. The first to third middle adhesives 10, 20 and 30 and the first to third middle semiconductor chips 15, 25 and 35 may be formed the same as those illustrated in FIG. 3.

In such a case, the second middle adhesive 20 and the second semiconductor chip 25 may extend in to the first peripheral region P1 of FIG. 1 from the first middle adhesive and semiconductor chip 10 and 15 by a length L. The third middle adhesive 30 and the third semiconductor chip 35 may extend into the first peripheral region P1 of FIG. 1 from the second middle adhesive and semiconductor chip 20 and 25 by the length L. The first middle adhesive and semiconductor chip 10 and 15 and the second middle adhesive and semiconductor chip 20 and 25 may form a step difference (SD) therebetween. The second middle adhesive and semiconductor chip 20 and 25 and the third middle adhesive and semiconductor chip 30 and 35 may form the SD therebetween.

The first to third middle adhesives 10, 20 and 30, or the first to third middle semiconductor chips 15, 25, and 35 may be each exposed on both sides due to the first to third middle semiconductor chips 15, 25 and 35 being stacked in a staggered arrangement. Afterwards, middle via holes 40 and middle through silicon vias 45 may be formed in the first to third middle adhesives 10, 20 and 30 and the first to third middle semiconductor chips 15, 25 and 35. Middle pads 50 and middle reinterconnections 55 may be formed on the third middle semiconductor chip 35. The middle via holes 40, the middle through silicon vias 45, the middle pads 50 and the middle reinterconnections 55 may be formed the same as those illustrated in FIG. 3.

As a result, the middle through silicon vias 45 and the middle pads 50 may constitute a second middle chip stacked structure 64 together with the first to third middle adhesives 10, 20 and 30, the first to third middle semiconductor chips 15, 25 and 35 and the middle reinterconnections 55.

Figure 10:
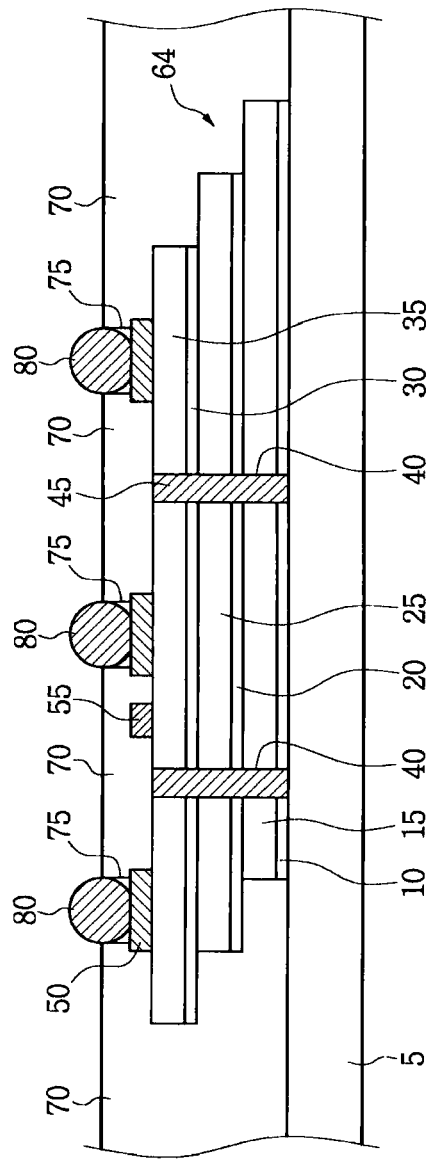

Referring to FIGS. 10 and 11, according to example embodiments, a middle protection layer 70 may be formed on a carrier 5 to cover the second middle chip stacked structure 64 as illustrated in FIG. 10. Middle molding holes 75 and middle solder balls 80 may be formed on the middle protection layer 70 as illustrated in FIG. 10. The middle protection layer 70, the middle molding holes 75 and the middle solder balls 80 may be formed the same as those illustrated in FIG. 4. Then, the carrier 5 may be removed from the first middle adhesive 10 and the middle protection layer 70 as illustrated in FIG. 11.

The first middle adhesive 10 may be exposed from the middle protection layer 70. As a result, the second middle chip stacked structure 64, the middle protection layer 70 and the middle solder balls 80 may constitute a second middle package 86 as illustrated in FIG. 11.

Referring to FIG. 12, a lower printed circuit board 90 may be prepared according to example embodiments. The lower printed circuit board 90 may have external connection pads 94 and external connection solder balls 98 on a selected surface thereof. First to third lower adhesives 100, 110 and 120 and first to third lower semiconductor chips 105, 115 and 125 may be sequentially formed on the lower printed circuit board 90. The first to third lower adhesives 100, 110 and 120 and the first to third lower semiconductor chips 105, 115 and 125 may be formed on a surface facing the selected surface.

The first to third lower adhesives 100, 110 and 120 may be formed below the first to third lower semiconductor chips 105, 115 and 125. The first to third lower adhesives 100, 110 and 120 and the first to third lower semiconductor chips 105, 115 and 125 may be formed the same as those illustrated in FIG. 6. In such a case, the second lower adhesive 110 and the second lower semiconductor chip 115 may extend into the first peripheral region P1 of FIG. 1 from the first middle adhesive and semiconductor chip 100 and 105 by a length L. The third lower adhesive 120 and the third lower semiconductor chip 125 may extend in to the first peripheral region P1 of FIG. 1 from the second lower adhesive and semiconductor chip 110 and 115 by the length L.

The first lower adhesive and semiconductor chip 100 and 105 and the second lower adhesive and semiconductor chip 110 and 115 may form a SD therebetween. The second lower adhesive and semiconductor chip 110 and 115 and the third lower adhesive and semiconductor chip 120 and 125 may form the SD therebetween. The first to third lower adhesives 100, 110 and 120, or the first to third lower semiconductor chips 105, 115 and 125 may be each exposed on both sides due to the first to third middle semiconductor chips 15, 25 and 35 being stacked in a staggered arrangement. Lower via holes 130 and lower through silicon vias 135 may be formed in the first to third lower adhesives 100, 110 and 120 and the first to third lower semiconductor chips 105, 115 and 125.

Lower pads 140 and lower reinterconnections 145 may be formed on the third lower semiconductor chip 125. The lower via holes 130, the lower through silicon vias 135, the lower pads 140 and the lower reinterconnections 145 may be formed the same as those illustrated in FIG. 6. The lower through silicon vias 135, and the lower pads 140 may constitute a second lower chip stacked structure 155 together with the lower printed circuit board 90, the first to third lower adhesives 100, 110 and 120, the first to third lower semiconductor chips 105, 115 and 125 and the lower reinterconnections 145. The second lower chip stacked structure 155 may be formed on the carrier 5 of FIG. 1, and then may be shifted to the lower printed circuit board 90 from the carrier 5.

A lower protection layer 160 may be formed on the lower printed circuit board 90 to cover the second lower chip stacked structure 155. Lower molding holes 165 and lower solder balls 170 may be formed in the lower protection layer 160. The lower protection layer 160, the lower molding holes 165 and the lower solder balls 170 may be formed the same as those illustrated in FIG. 6. As a result, the second lower chip stacked structure 155, the lower protection layer 160 and the lower solder balls 170 may constitute a second lower package 178. The lower solder balls 170 may be excluded from the second lower package 178.

Referring to FIG. 13, according to example embodiments, the second middle package 86 of FIG. 11 may be stacked on the second lower package 178 of FIG. 12. In such a case, lower and upper parts of the first middle package 86 may be modified as shown in FIG. 13. The middle solder balls 80 of the second middle package 86 may be in contact with the lower pads 140 of the second lower package 178. A middle printed circuit board 230 may be formed on the second middle package 86. The middle printed circuit board 230 may be electrically connected to middle through silicon vias 45.

The middle printed circuit board 230 may have internal connection pads 235. The upper package 220 of FIG. 7 may be stacked on the middle printed circuit board 230. Upper solder balls 188 of the upper package 220 may be in contact with the internal connection pads 235. As a result, the upper package 220, the second lower package 178 and the second middle package 86 may constitute a second semiconductor package structure 244.

In such a case, the first lower chip stacked structure 155 of the second lower package 178 may be formed in a lower central region C2 and a second peripheral region P2 of the second semiconductor package structure 244 with respect to the third lower semiconductor chip 125. A second middle chip stacked structure 64 of the second middle package 86 may be formed in the lower central region C2 and the second peripheral region P2 of the second semiconductor package structure 244 with respect to the third middle semiconductor chip 35. The upper chip stacked structure 210 of the upper package 220 may be formed in the upper central region C1 of the second semiconductor package structure 244.

A unit of the second lower package 178, the second middle package 86 and the middle printed circuit board 230 may be stacked at least once below the upper package 220 in a repeated manner. In such a case, external connection solder balls 98 of the second lower package 178 may be in contact with the internal connection balls 235 of the middle printed circuit board 230.

Figure 15:
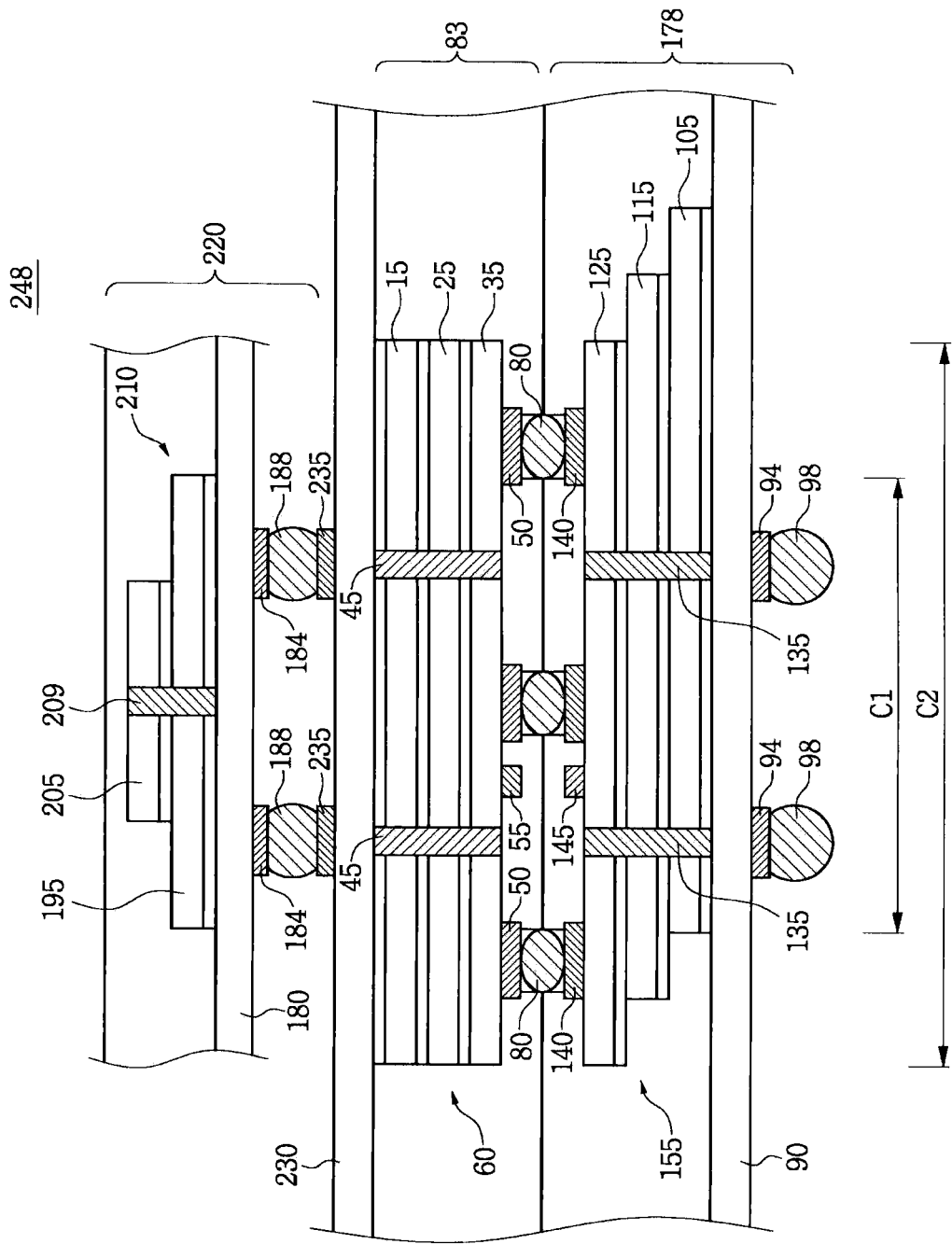

FIGS. 14 and 15 are cross-sectional views taken along line of FIG. 1, illustrating a method of forming a semiconductor package structure according to example embodiments. In FIGS. 14 and 15, like reference numerals designate like elements as in FIGS. 3 to 8.

Referring to FIG. 14, according to example embodiments, the second middle package 86 of FIG. 13 may be stacked on the second lower package 178 of FIG. 12. In such a case, lower and upper parts of the second middle package 86 of FIG. 13 may be modified as shown in FIG. 14. As a result, the second middle package 86 of FIG. 13 may be replaced by the third middle package 89 of FIG. 14. The third middle package 89 may have a third middle chip stacked structure 68. The third middle chip stacked structure 68 may have the same components as the second middle chip stacked structure 64 of the second middle package 86. However, the third middle chip stacked structure 68 may have both sides rotated the left and right sides of the second middle chip stacked structure 64 by 180 degrees.

The middle solder balls 80 of the third middle package 89 may be in contact with the lower pads 140 of the second lower package 178. A middle printed circuit board 230 may be formed on the third middle package 89. The middle printed circuit board 230 may have internal connection pads 235. The upper package 220 may be stacked on the middle printed circuit board 230. The upper solder balls 188 of the upper package 220 may be in contact with the internal connection pads 235 of the middle printed circuit board 230.

The upper package 220, the second lower package 178 and the third middle package 89 may constitute a third semiconductor package structure 246. In such a case, the second lower chip stacked structure 155 of the second lower package 178 may be formed in the lower central region C2 and the second peripheral region P2 of the third semiconductor package structure 246 with respect to the third lower semiconductor chip 125. The third middle chip stacked structure 68 of the third middle package 89 may be formed in the lower central region C2 and the first peripheral region P1 of the third semiconductor package structure 246 with respect to the third middle semiconductor chip 35.

The upper chip stacked structure 210 of the upper package 220 may be formed in the upper central region C1 of the third semiconductor package structure 246. A unit of the second lower package 178, the third middle package 89 and the middle printed circuit board 230 may be stacked at least once below the upper package 220 in a repeated manner. In such a case, the external connection solder balls 98 of the second lower package 178 may be in contact with the internal connection pads 235 of the middle printed circuit board 230.

Referring to FIG. 15, according to example embodiments, the first middle package 83 of FIG. 5 may be stacked on the second lower package 178 of FIG. 12. The middle solder balls 80 of the first middle package 83 may be in contact with the lower pads 140 of the second lower package 178. A middle printed circuit board 230 may be formed on the first middle package 83. The middle printed circuit board 230 may have internal connection pads 235.

An upper package 220 may be stacked on the middle printed circuit board 230. The upper solder balls 188 of the upper package 220 may be in contact with the internal connection pads 235 of the middle printed circuit board 230. The upper package 220, the second lower package 178 and the first middle package 83 may constitute a fourth semiconductor package structure 248. In such a case, the second lower chip stacked structure 155 of the second lower package 178 may be formed in the lower central region C2 and the second peripheral region P2 of the fourth semiconductor package structure 248 with respect to the third lower package semiconductor chip 125.

The first middle chip stacked structure 60 of the first middle package 83 may be formed in the lower central region C2 of the fourth semiconductor package structure 248. An upper chip stacked structure 210 of the upper package 220 may be formed in the upper central region C1 of the fourth semiconductor package structure 246. A unit of the second lower package 178, the first middle package 83 and the middle printed circuit board 230 may be stacked at least once below the upper package 220 in a repeated manner.

In such a case, the external connection solder balls 98 of the second lower package 178 may be in contact with the internal connection solder balls 235 of the middle printed circuit board 230. Further, the left and right sides of the second to fourth semiconductor package structures 244, 246 and 248 of FIGS. 13, 14 and 15 may be rotated by 180 degrees to be modified. In addition, the second middle package 86 of FIG. 13 and the upper package 220 of FIG. 7 or the third middle package 89 of FIG. 14 and the upper package 220 of FIG. 7 may be stacked on the first lower package 174 of FIG. 6.

The left and right sides of the first lower package 174, the second middle package 86 and the upper package 220 may be rotated by 180 degrees to be modified. The left and right sides of the first lower package 174, the third middle package 89 and the upper package 220 may be rotated by 180 degrees to be modified.

Figure 16:
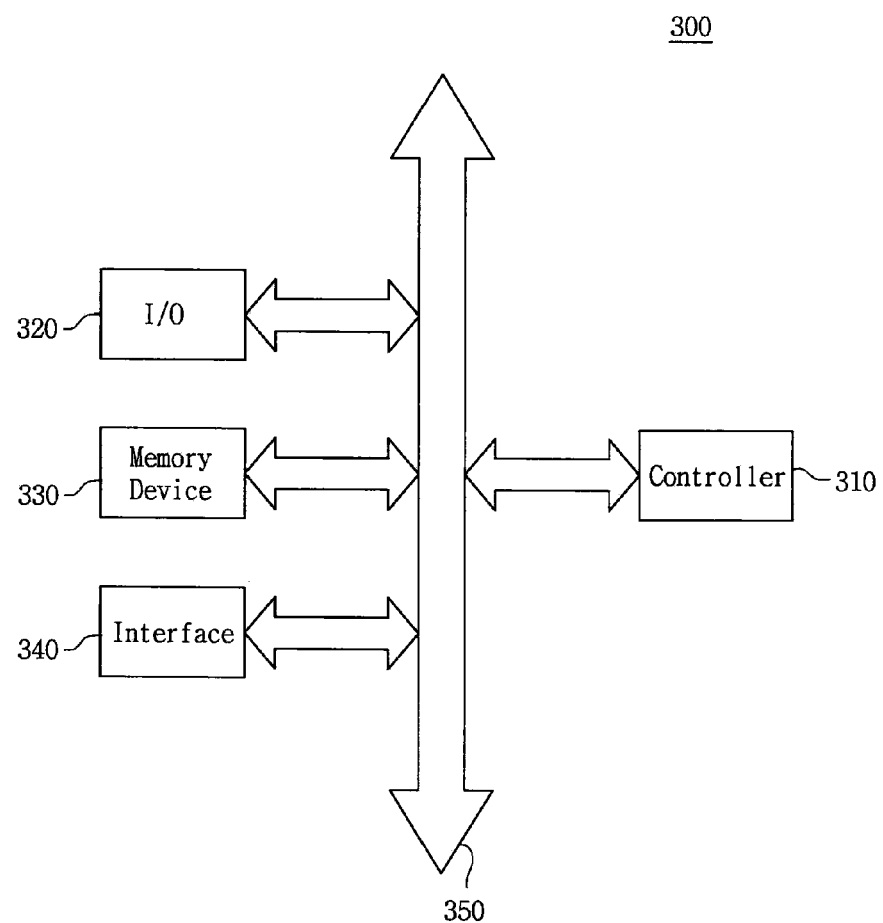
FIG. 16 is a block diagram illustrating an electronic system including the semiconductor package according to example embodiments.

FIG. 16 is a block diagram illustrating an electronic system including a semiconductor package structure according to example embodiments.

Referring to FIG. 16, an electronic system 300 according to example embodiments may include a controller 310, an I/O device 320, a memory device 330, an interface 340, and a bus 350. The controller 310, the I/O device 320, the memory device 330, and/or the interface 340 may be connected to each other through the bus 350. The bus 350 serves as a path through which data is transmitted.

The controller 310 may include at least one of a microprocessor, a digital signal process, a micro controller, and logic devices executing a similar function thereof. The I/O device 320 may include a keypad, a keyboard, and a display device. The memory device 330 may store data and/or commands. The memory device 330 may include at least one of the semiconductor package structures 242, 244, 246 and 248 described in the example embodiments of FIGS. 1, 8 and 13-15. Moreover, the memory device 330 may further include different kinds of semiconductor memory devices (for example, a phase change memory device, a magnetic memory device, a DRAM device, and/or an SRAM device). The interface 340 executes a function of transmitting or receiving data to or from a communication network. The interface 340 may be formed of a wired type or a wireless type. For example, the interface 140 may include an antenna or a wired and wireless transceiver. Even though not illustrated, the electronic system 300 may further include a high-speed DRAM and/or a high-speed SRAM as an operational memory for improving the operation of the controller 310.

The electronic system 300 may be applicable to a personal digital assistant (PDA), a portable computer, a web tablet, a wireless phone, a mobile phone, a digital music player, a memory card, or all electronic apparatuses capable of transmitting and/or receiving information in a wireless environment.

Figure 17:
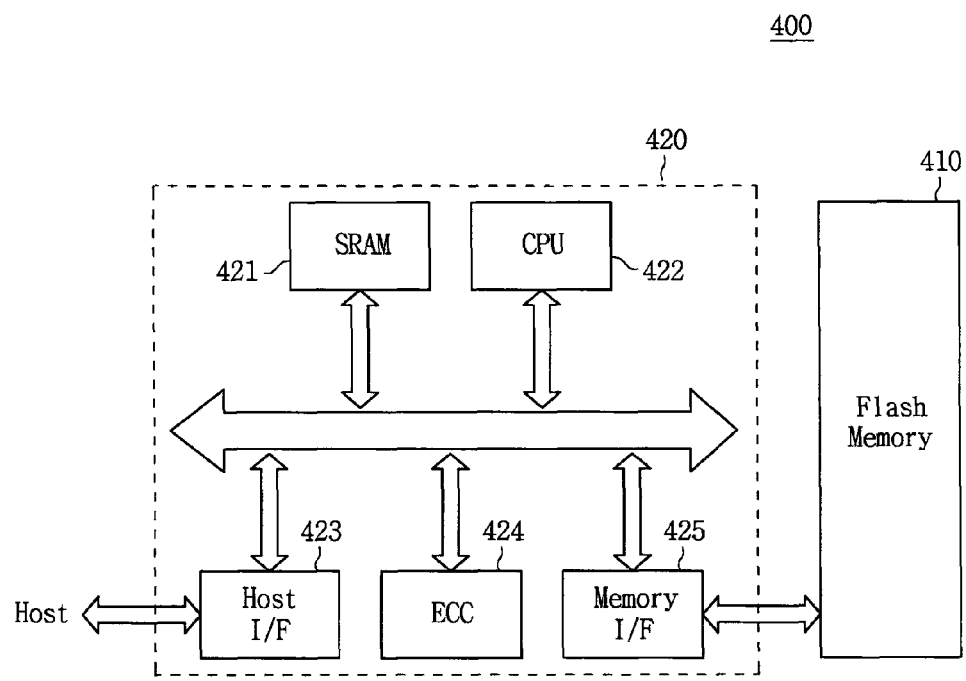
FIG. 17 is a block diagram illustrating a memory card including the semiconductor package according to example embodiments.

FIG. 17 is a block diagram illustrating a memory card including a semiconductor package structure according to example embodiments.

Referring to FIG. 17, a memory card 400 includes a memory device 410. The memory device 410 may include at least one of the semiconductor package structures 242, 244, 246 and 248 described in the example embodiments of FIGS. 1, 8 and 13-15. The memory card 400 may include a memory controller 420 controlling data exchange between a host and the memory device 410.

The memory controller 420 may include a processing unit 422 controlling a general operation of the memory card. The memory controller 420 may include an SRAM 421 used as an operational memory of the processing unit 422. The memory controller 420 may further include a host interface 423 and a memory interface 425. The host interface 423 may include a protocol for exchanging data between the memory card 400 and the host. The memory interface 425 may connect the memory controller 420 to the memory device 410. The memory controller 420 may further include an error correction block (ECC) 424. The error correction block 424 may detect and correct errors of data read from the memory device 410. Even though not illustrated, the memory card 400 may further include a ROM device for storing code data for interfacing the host. The memory card 400 may be used as a portable data memory card. Alternatively, the memory card 400 may be realized as a solid state disk (SSD) capable of replacing a hard disk of a computer system.

As described above, a semiconductor package structure according to example embodiments does not have a printed circuit board between adjacent lower and middle chip stacked structures. Each of the lower and middle chip stacked structures can have semiconductor chips that are sequentially stacked. As a result, the semiconductor package structure can reduce the overall thickness and embody higher integration density regardless of the number of stacked semiconductor chips.

Furthermore, a semiconductor package structure according to example embodiments does not have a printed circuit board between lower and middle chip stacked structures, but may have two printed circuit boards between middle and upper chip stacked structures. Each of the lower to upper chip stacked structures can have semiconductor chips that are sequentially stacked. The upper chip stacked structure can perform a different function from the lower and middle chip stacked structures in terms of circuit. As a result, the semiconductor package structure can implement multi-functionalization with a process margin.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor package structure, comprising:
a first package having at least one first semiconductor chip disposed on a first printed circuit board, and at least one first pad disposed on the at least one first semiconductor chip;
a second package having at least one second pad disposed on the first package, and at least one second semiconductor chip disposed on the at least one second pad; and
at least one first solder ball disposed between the first package and the second package, the at least one first solder ball being in contact with the at least one first pad and the at least one second pad, wherein
the at least one first semiconductor chip is electrically connected to the first printed circuit board,
the at least one second pad is electrically connected to the at least one second semiconductor chip, and
the at least one second pad faces the at least one first pad.

2. The structure of claim 1, further comprising:
a second printed circuit board disposed on the second package;
a third package having at least one third semiconductor chip disposed on the second printed circuit board, and at least one third pad disposed on the at least one third semiconductor chip; and
a fourth package having at least one fourth pad disposed on the third package, and at least one fourth semiconductor chip disposed on the at least one fourth pad, wherein
the second printed circuit board is electrically connected to the second package,
the at least one fourth pad is electrically connected to the at least one fourth semiconductor chip, and
the at least one fourth pad faces the at least one third pad.

3. The structure of claim 2, further comprising:
at least one second solder ball disposed between the third package and the fourth package, the at least one second solder ball being in contact with
the at least one third pad and the at least one fourth pad.

4. The structure of claim 3, wherein,
the at least one first pad is electrically connected to the at least one first semiconductor chip, and
the at least one third pad is electrically connected to the at least one third semiconductor chip.

5. The structure of claim 1, further comprising:
a second printed circuit board; and
a third package, with the second printed circuit board and the third package stacked sequentially on the second package, wherein
the second package is electrically connected to the third package through the second printed circuit board.

6. The structure of claim 1, further including a first protection layer covering the first package, the first protection layer exposing the at least one first pad, and a second protection layer covering the second package, the second protection layer exposing the at least one second pad, wherein the first protection layer is in direct contact with the second protection layer.

7. A semiconductor package structure, comprising:
a first package having at least one first semiconductor chip disposed on a first printed circuit board, at least one first connection and at least one first pad, where the at least one first connection and the at least one first pad are disposed at a same level on the at least one first semiconductor chip; and
a second package having at least one first solder ball disposed on the first package, at least one second connection and at least one second pad, where the at least one second connection and the at least one second pad are disposed on the at least one first solder ball and arranged at a same level, and at least one second semiconductor chip is disposed on the at least one second connection and the at least one second pad, wherein
the at least one first semiconductor chip is electrically connected to the first printed circuit board, the at least one first solder ball and the at least one second connection,
the at least one second pad is electrically connected to the at least one second semiconductor chip, and the at least one first pad faces the at least one first solder ball, and
the at least one first solder ball is in contact with the at least one first pad and the at least one second pad.

8. The structure of claim 7, further comprising:
a second printed circuit board disposed on the second package;
a third package having at least one third semiconductor chip disposed on the second printed circuit board, at least one third connection and at least one third pad, where the at least one third connection and the at least one third pad are disposed on the at least one third semiconductor chip and arranged at a same level; and
a fourth package having at least one second solder ball disposed on the third package, at least one fourth connection and at least one fourth pad, where the at least one fourth connection and the at least one fourth pad are disposed on the at least one second solder ball and arranged at a same level, and at least one fourth semiconductor chip disposed on the at least one fourth connection and the at least one fourth pad, wherein the at least one third semiconductor chip is electrically connected to the second printed circuit board, the at least one second solder ball and the at least one fourth connection, the at least one fourth pad is electrically connected to the at least one fourth semiconductor chip, and the at least one third pad faces the at least one second solder ball.

9. The structure of claim 8, wherein, the at least one first semiconductor chip includes a plurality of first semiconductor chips sequentially stacked on the first printed circuit board, and the plurality of first semiconductor chips including two sides of the plurality of first semiconductor chips disposed across one of a same region and different regions such that at least one of the two sides of the plurality of first semiconductor chips is exposed, and the at least one second semiconductor chip includes a plurality of second semiconductor chips sequentially stacked on the plurality of first semiconductor chips, and the plurality of second semiconductor chips including two sides of the plurality of second semiconductor chips disposed across one of a same region and different regions such that at least one of the two sides of the plurality of second semiconductor chips is exposed.

10. The structure of claim 9, wherein the at least one third semiconductor chip includes a plurality of third semiconductor chips sequentially stacked on the second printed circuit board, and the plurality of third semiconductor chips including two sides of the plurality of third semiconductor chips disposed across one of a same region and different regions such that at least one of the two sides of the plurality of third semiconductor chips is exposed, and the at least one fourth semiconductor chip includes a plurality of fourth semiconductor chips sequentially stacked on the plurality of third semiconductor chips, and the plurality of fourth semiconductor chips including two sides of the plurality of fourth semiconductor chips disposed across one of a same region and different regions such that at least one of the two sides of the plurality of fourth semiconductor chips is exposed.

11. The structure of claim 10, wherein, the at least one first connection and the at least one first pad face the at least one second connection and the at least one second pad, the at least one third connection and the at least one third pad face the at least one fourth connection and the at least one fourth pad, and the at least one second solder ball is in contact with the at least one third pad and the at least one fourth pad.

12. The structure of claim 11, wherein, the at least one first pad is electrically connected to at least one of the plurality of first semiconductor chips, the at least one third pad is electrically connected to at least one of the plurality of third semiconductor chips, a part of the at least one first connection is in contact with the at least one first pad, a part of the at least one second connection is in contact with the at least one second pad, a part of the at least one third connection is in contact with the at least one third pad, and a part of the at least one fourth connection is in contact with the at least one fourth pad.

13. The structure of claim 12, wherein, the at least one first semiconductor chip includes at least one first via, the at least one first via penetrates the plurality of first semiconductor chips to electrically connect the plurality of first semiconductor chips to each other, and the remaining part of the at least one first connections is in contact with the at least one first via, and the at least one second semiconductor chip includes at least one second via, the at least one second via penetrates the plurality of second semiconductor chips to electrically connect the plurality of second semiconductor chips to each other, and the remaining part of the at least one second connections is in contact with the at least one second via.

14. The structure of claim 13, wherein, the at least one third semiconductor chip includes at least one third via, the at least one third via penetrates the plurality of third semiconductor chips to electrically connect the plurality of third semiconductor chips to each other, and the remaining part of the at least one third connections is in contact with the at least one third via, and the at least one fourth semiconductor chip includes at least one fourth via, the at least one fourth via penetrates the plurality of fourth semiconductor chips to electrically connect the plurality of fourth semiconductor chips to each other, and the remaining part of the at least one fourth connections is in contact with the at least one fourth via.

15. The structure of claim 14, further comprising:

a third printed circuit board; and a fifth package, wherein the third printed circuit board and the fifth package are sequentially stacked on the fourth package, and the fourth package is electrically connected to the fifth package through the third printed circuit board.

16. The structure of claim 7, further comprising:

a second printed circuit board; and a third package, wherein the second printed circuit and the third package are sequentially stacked on the second package, and the second package is electrically connected to the third package through the second printed circuit board.

17. A semiconductor package structure, comprising:

a first package having at least one first semiconductor chip disposed on a first printed circuit board, and at least one first pad disposed on the at least one first semiconductor chip;

a second package having at least one second pad disposed on the first package, and at least one second semiconductor chip disposed on the at least one second pad;

at least one first solder ball disposed between the first package and the second package;

a second printed circuit board; and a third package, wherein the second printed circuit board and the third package are sequentially stacked on the second package, the first and second packages are electrically connected to each other through the at least one first pad and the at least one second pad, the at least first pad and the at least one second pad being in contact with the at least one first solder ball, the at least one second pad is electrically connected to the at least one second semiconductor chip to face the at least one first pad, and the second package is electrically connected to the third package through the second printed circuit board.

18. The structure of claim 17, wherein, the at least one first semiconductor chip includes a plurality of first semiconductor chips sequentially stacked on the first printed circuit board, and the plurality of first semiconductor chips including two sides of the plurality of first semiconductor chips disposed across one of a same region and different regions such that at least one of the two sides of the plurality of first semiconductor chips is exposed, and the at least one second semiconductor chip includes a plurality of second semiconductor chips sequentially stacked on the plurality of first semiconductor chips, and the plurality of second semiconductor chips including two sides of the plurality of second semiconductor chips disposed across one of a same region and different regions such that at least one of the two sides of the plurality of second semiconductor chips is exposed.

19. The structure of claim 18, wherein, the first printed circuit board has a controller electrically connected to the plurality of first semiconductor chips, the plurality of first semiconductor chips are electrically connected to each other through wires disposed in the exterior of the plurality of first semiconductor chips, the wires are electrically connected to the first printed circuit board, the plurality of second semiconductor chips include at least one second via that penetrates the plurality of second semiconductor chips to electrically connect the plurality of second semiconductor chips, and the at least one second via is in contact with the second printed circuit board.

20. The structure of claim 19, wherein, the at least one first pad is electrically connected to at least one of the plurality of first semiconductor chips, the second printed circuit board includes at least one third pad, the third package includes a third printed circuit board and at least one third semiconductor chip electrically connected to each other, the third printed circuit board includes at least one second solder ball and at least one fourth pad stacked sequentially, and the at least one second solder ball is in contact with the at least one third pad and the at least one fourth pad.

* * * * *